(12) United States Patent
Heo

(10) Patent No.: US 12,389,753 B2
(45) Date of Patent: Aug. 12, 2025

(54) LIGHT EMITTING DISPLAY APPARATUS

(71) Applicant: LG Display Co., Ltd., Seoul (KR)

(72) Inventor: JoonYoung Heo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 406 days.

(21) Appl. No.: 18/121,316

(22) Filed: Mar. 14, 2023

(65) Prior Publication Data

US 2023/0320141 A1 Oct. 5, 2023

(30) Foreign Application Priority Data

Mar. 29, 2022 (KR) .................. 10-2022-0039020
Jun. 3, 2022 (KR) .................. 10-2022-0068275

(51) Int. Cl.
*H10K 59/122* (2023.01)
*H10K 50/11* (2023.01)
*H10K 59/12* (2023.01)
*H10K 59/80* (2023.01)

(52) U.S. Cl.
CPC ......... *H10K 59/122* (2023.02); *H10K 50/11* (2023.02); *H10K 59/1201* (2023.02); *H10K 59/80521* (2023.02)

(58) Field of Classification Search
CPC .. H10K 59/122; H10K 59/865; H10K 59/179; H10K 59/00; H10K 50/11
See application file for complete search history.

(56) References Cited

U.S. PATENT DOCUMENTS

| | | | | |
|---|---|---|---|---|
| 2016/0315283 A1* | 10/2016 | Kim | ............... | H10K 59/122 |
| 2017/0278906 A1* | 9/2017 | Song | ............... | H10K 59/122 |
| 2021/0405797 A1* | 12/2021 | Bae | ............... | H10K 50/846 |
| 2023/0320176 A1* | 10/2023 | Heo | ............... | H10K 59/122 |
| | | | | 257/40 |
| 2024/0260367 A1* | 8/2024 | Kim | ............... | H10K 59/353 |
| 2025/0053049 A1* | 2/2025 | Liao | ............... | G02F 1/136286 |
| 2025/0093695 A1* | 3/2025 | Shin | ............... | G06F 3/0443 |

FOREIGN PATENT DOCUMENTS

KR 10-2021-0084878 A 7/2021

* cited by examiner

*Primary Examiner* — Walter L Lindsay, Jr.
(74) *Attorney, Agent, or Firm* — Birch, Stewart, Kolasch & Birch, LLP

(57) ABSTRACT

A light emitting display apparatus can include a plurality of first pixels arranged in a first direction of a display area displaying an image, a plurality of second pixels arranged in parallel with the plurality of first pixels in the first direction in the display area, a plurality of third pixels arranged in parallel with the plurality of second pixels in the first direction in the display area, a first emission layer wall and a second emission layer wall provided at a first outer portion and a second outer portion of outer portions surrounding the plurality of first pixels and the plurality of second pixels, a main cathode covering an upper end of a main emission layer provided in the plurality of first pixels and the plurality of second pixels, and a sub-cathode covering an upper end of a sub emission layer provided in the third pixels.

12 Claims, 34 Drawing Sheets

LIGHT EMITTING DISPLAY APPARATUS

CROSS-REFERENCE TO RELATED APPLICATIONS

This application claims the priority benefit of the Korean Patent Application No. 10-2022-0039020 filed on Mar. 29, 2022 in the Republic of Korea and the Korean Patent Application No. 10-2022-0068275 filed on Jun. 3, 2022 in the Republic of Korea, the entire contents of all these applications being hereby expressly incorporated by reference into the present application.

BACKGROUND

Field of the Invention

The present disclosure relates to a light emitting display apparatus.

Discussion of the Related Art

A light emitting display apparatus includes light emitting devices provided in pixels, and each of the light emitting devices includes an anode, a light emitting layer, and a cathode.

Among the pixels, a main emission layer configuring red and green pixels is formed at the same time, and a sub emission layer configuring a blue pixel is formed through a separate process. In this case, the main emission layer and the sub emission layer can be formed using a shield layer and a photoresist.

If the sub emission layer is formed after the main emission layer is formed, sidewalls by the sub emission layer can be formed around the main emission layer, and accordingly, a cathode covering the main emission layer and the sub emission layer may not be connected.

SUMMARY OF THE DISCLOSURE

Accordingly, the present disclosure is directed to providing a light emitting display apparatus that substantially obviates one or more problems due to limitations and disadvantages of the related art.

An aspect of the present disclosure is directed to providing a light emitting display apparatus in which emission layer walls formed by sub emission layers are provided only on some of the outer portion surrounding a main emission layer.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided a light emitting display apparatus including a plurality of first pixels arranged in a first direction of a display area displaying an image, a plurality of second pixels arranged in parallel with the plurality of first pixels in the first direction in the display area, a plurality of third pixels arranged in parallel with the plurality of second pixels in the first direction in the display area, a first emission layer wall and a second emission layer wall provided at a first outer portion and a second outer portion, facing each other in the first direction, of outer portions surrounding the plurality of first pixels and the plurality of second pixels, a main cathode covering an upper end of a main emission layer provided in the plurality of first pixels and the plurality of second pixels, and a sub-cathode covering an upper end of a sub emission layer provided in the third pixels, wherein the main cathode and the sub-cathode are divided in the second emission layer wall, and the main cathode and the sub-cathode are connected with each other in at least one of the other outer portions except the first outer portion and the second outer portion.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
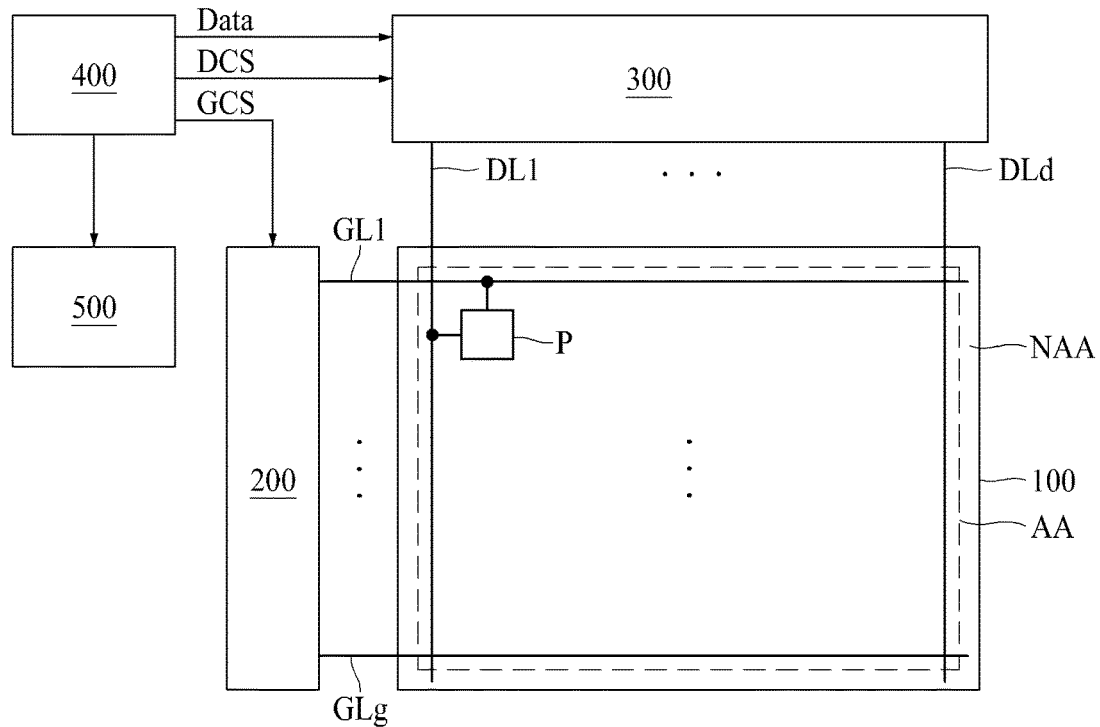
FIG. 1 is an exemplary diagram illustrating a configuration of a light emitting display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part can be added unless "only" is used. The terms of a singular form can include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," "below," and "next," one or more other parts can be disposed between the two parts unless a more limiting term, such as "just" or "direct(ly)" is used.

In describing a time relationship, for example, when the temporal order is described as, for example, "after," "subsequent," "next," and "before," a case that is not continuous can be included unless a more limiting term, such as "just," "immediate(ly)," or "direct(ly)" is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc. can be used. These terms are intended to identify the corresponding elements from the other elements, and basis, order, or number of the corresponding elements should not be limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of the present disclosure will be described in detail with reference to the accompanying drawings. All the components of each light emitting display apparatus according to all embodiments of the present disclosure are operatively coupled and configured.

Figure 2:
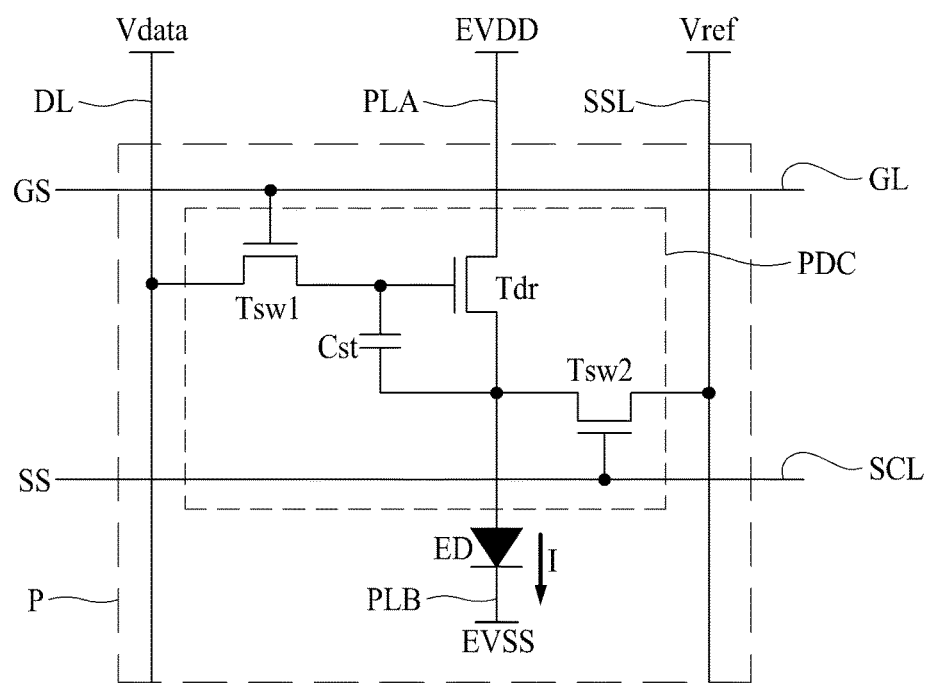
FIG. 2 is an exemplary diagram illustrating a structure of a pixel applied to a light emitting display apparatus according to an embodiment of the present disclosure.

FIG. 1 is an exemplary diagram illustrating a configuration of a light emitting display apparatus according to the present disclosure and FIG. 2 is an exemplary diagram illustrating a structure of a pixel applied to a light emitting display apparatus according to the present disclosure.

The light emitting display apparatus according to the present disclosure can configure various electronic devices. The electronic devices can include, for example, smartphones, tablet personal computers (PCs), televisions (TVs), and monitors.

The light emitting display apparatus according to the present disclosure, as illustrated in FIG. 1, can include a light emitting display panel 100 which includes a display area (or active area) AA for displaying an image and a non-display area (or non-active area) NAA provided outside the display area AA, a gate driver 200 which supplies a gate signal to a plurality of gate lines GL1 to GLg (g can be a positive integer) provided in the display area AA of the light emitting display panel 100, a data driver 300 which supplies data voltages to a plurality of data lines DL1 to DLd (d can be a positive integer) provided in the light emitting display panel 100, a controller 400 which controls driving of the gate driver 200 and the data driver 300, and a power supply 500 which supplies power to the controller 400, the gate driver 200, the data driver 300, and the light emitting display panel 100.

First, the light emitting display panel 100 can include the display area AA and the non-display area NAA. The gate lines GL1 to GLg, the data lines DL1 to DLd, and the pixels P can be provided in the display area AA. Accordingly, the display area AA can display an image. Here, g and d can each be a natural number. The non-display area NAA can surround an outer portion of the display area AA.

An example of the pixel P included in the light emitting display panel 100 is illustrated in FIG. 2. As shown in FIG. 2, the pixel P can include a pixel driving circuit PDC, including a switching transistor Tsw1, a storage capacitor Cst, a driving transistor Tdr, and a sensing transistor Tsw2, and a light emitting device ED. Each of the pixels P can have the configuration shown in FIG. 2.

A first terminal of the driving transistor Tdr can be connected to a first voltage supply line PLA through which a first voltage EVDD is supplied, and a second terminal of the driving transistor Tdr can be connected to the light emitting device ED.

A first terminal of the switching transistor Tsw1 can be connected to the data line DL, a second terminal of the switching transistor Tsw1 can be connected to a gate of the driving transistor Tdr, and a gate of the switching transistor Tsw1 can be connected to a gate line GL.

A data voltage Vdata can be supplied to a data line DL, and a gate signal GS can be supplied to the gate line GL.

The sensing transistor Tsw2 can be provided for measuring a threshold voltage or mobility of the driving transistor. A first terminal of the sensing transistor Tsw2 can be connected to a second terminal of the driving transistor Tdr and the light emitting device ED, a second terminal of the sensing transistor Tsw2 can be connected to a sensing line SSL through which a reference voltage Vref is supplied, and a gate of the sensing transistor Tsw2 can be connected to a sensing control line SCL through which a sensing control signal SS is supplied.

The sensing line SSL can be connected to the data driver 300 and can be connected to the power supply 500 through the data driver 300. For example, the reference voltage Vref supplied from the power supply 500 can be supplied to the pixels through the sensing line SSL, and sensing signals transferred from the pixels can be processed by the data driver 300.

A light emitting device ED can include a first electrode supplied with the first voltage EVDD through the driving transistor Tdr, a second electrode connected to a second supply line PLB through which a second voltage EVSS is supplied, and an emission layer provided between the first electrode and the second electrode.

A structure of the pixel P applied to the present disclosure is not limited to a structure illustrated in FIG. 2. Accordingly, a structure of the pixel P can be changed to various shapes.

The controller 400 can realign input image data transferred from an external system by using a timing synchronization signal transferred from the external system and can generate a data control signal DCS which is to be supplied to the data driver 300 and a gate control signal GCS which is to be supplied to the gate driver 200.

To this end, the controller 400 can include a data aligner which realigns input image data to generate image data Data and supplies the image data Data to the data driver 300, a control signal generator which generates the gate control signal GCS and the data control signal DCS by using the timing synchronization signal, an input unit which receives the timing synchronization signal and the input image data transferred from the external system and respectively transfers the timing synchronization signal and the input image data to the control signal generator and the data aligner, and an output unit which supplies the data driver 300 with the image data Data generated by the data aligner and the data control signal DCS generated by the control signal generator and supplies the gate driver 200 with the gate control signal GCS generated by the control signal generator.

The external system can perform a function of driving the controller 400 and an electronic device. For example, when the electronic device is a TV, the external system can receive various sound information, video information, and letter information over a communication network and can transfer the received video information to the controller 400. In this case, the video information can be the input image data.

The power supply can generate various powers and can supply the generated powers to the controller 400, the gate driver 200, the data driver 300, and the light emitting display panel 100.

The gate driver 200 can be implemented as an integrated circuit (IC) and can be mounted in the non-display area NAA. Also, the gate driver 200 can be directly embedded into the non-display area NAA by using a gate-in panel (GIP) type. In a case where the GIP type is used, transistors configuring the gate driver 200 can be provided in the non-display area NAA through the same process as transistors included in each of the pixels P.

The gate driver 200 can supply gate pulses to the gate lines GL1 to GLg.

When the gate pulse generated by the gate driver 200 is supplied to the gate of the switching transistor Tsw1 provided in the pixel P, the switching transistor Tsw1 can be turned on. When the switching transistor Tsw1 is turned on, the data voltage Vdata supplied through the date line DL can be supplied to the pixel p.

When a gate-off signal generated by the gate driver 200 is supplied to the switching transistor Tsw1, the switching transistor Tsw1 can be turned off. When the switching transistor Tsw1 is turned off, the data voltage Vdata may not be supplied to the pixel P any longer.

A gate signal GS supplied to the gate line GL can include the gate pulse and the gate-off signal.

Finally, the data driver 300 can be provided on a chip on film (COF) attached on the light emitting display panel 100, or can be directly equipped in the light emitting display panel 100.

The data driver 300 can supply data voltages Vdata to the data lines DL1 to DLd.

Figure 3:
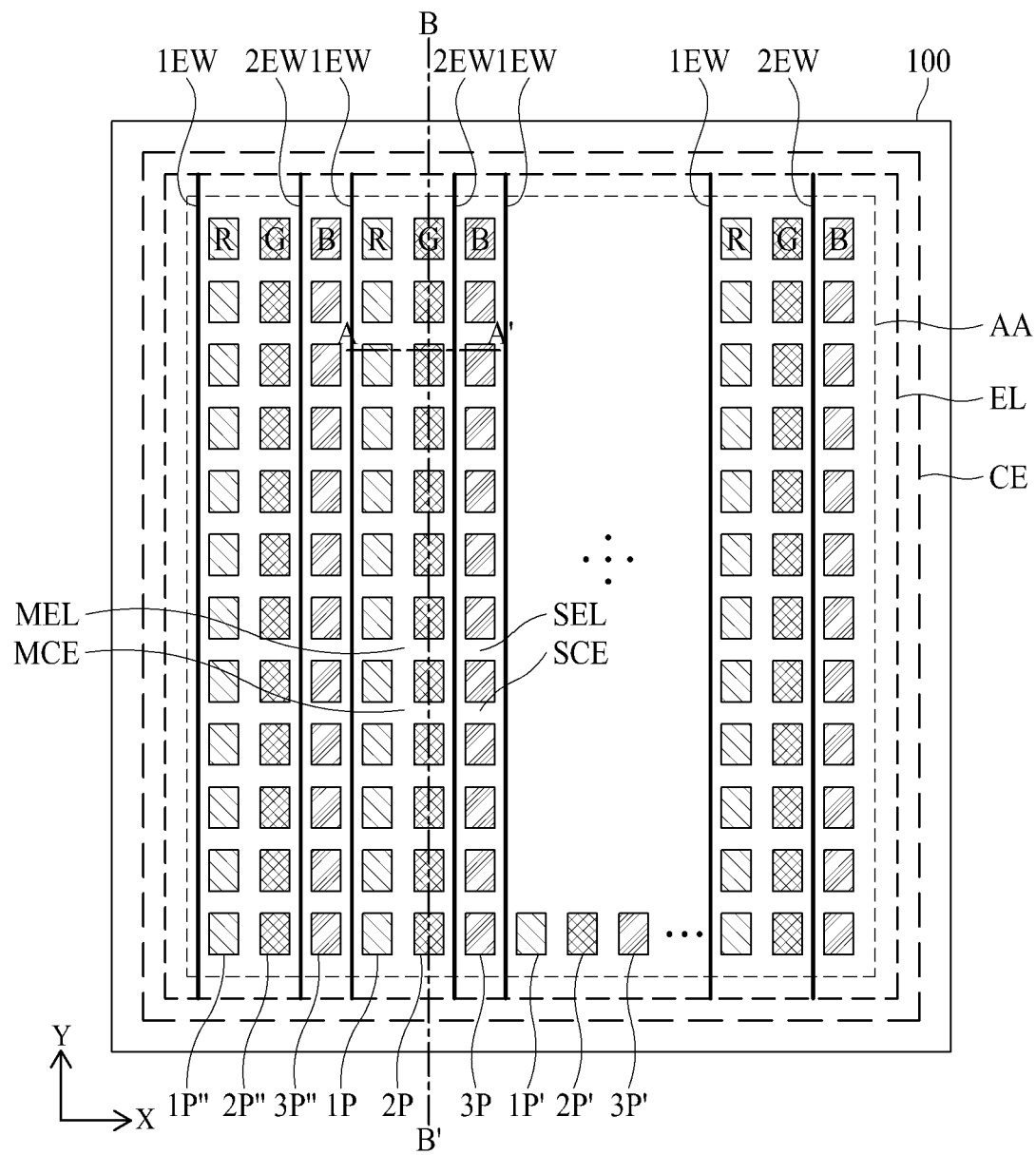
FIG. 3 is an exemplary diagram illustrating a one-dimensional configuration of a light emitting display panel applied to an embodiment of the present disclosure.

FIG. 3 is an exemplary diagram illustrating a one-dimensional configuration of a light emitting display panel applied to the present disclosure. More specifically, FIG. 3 is an exemplary diagram illustrating in detail a one-dimensional structure of the light emitting display panel 100 illustrated in FIG. 1.

As described above, a light emitting display apparatus according to the present disclosure can include a light emitting display panel 100 which includes gate lines GL1 to GLg and data lines DL1 to DLd, a controller 400, a gate driver 200, a data driver 300, and a power supply 500.

The light emitting display panel 100 can include a display area AA which displays an image and a non-display area NAA which surrounds the display area AA. A plurality of pixels P can be provided in the display area AA.

The light emitting display panel 100, as illustrated in FIG. 3, can include first pixels 1P which are arranged in a first direction Y of the display area AA displaying an image, second pixels 2P which are arranged in parallel with the first pixels 1P in the first direction Y in the display area AA, third pixels 3P which are arranged in parallel with the second pixels 2P in the first direction Y in the display area AA, a first emission layer wall 1EW and a second emission layer wall 2EW which are provided at a first outer portion and a second outer portion, facing each other in the first direction Y, of outer portions surrounding the first pixels 1P and the second pixels 2P, a main cathode MCE which covers an upper end of a main emission layer MEL provided in the first pixels 1P and the second pixels 2P, and a sub-cathode SCE which covers an upper end of a sub emission layer SEL provided in the third pixels 3P. The main cathode MCE and the sub-cathode SCE can be divided in the second emission layer wall 2EW, and the main cathode MCE can be connected with the sub-cathode SCE in at least one of the other outer portions except the first outer portion and the second outer portion.

For example, pixels having the same color can be arranged in the first direction Y, and pixels having different colors can be arranged in a second direction X. In this case, the first direction Y can be a direction parallel to a data line, and the second direction X can be a direction parallel to a gate line. Also, the first direction Y can be a direction parallel to the gate line, and the second direction X can be a direction parallel to the data line.

First, for example, the first pixels 1P can be red pixels R, the second pixels 2P can be green pixels G, and the third pixels 3P can be blue pixels B.

The first emission layer wall 1EW and the second emission layer wall 2EW, as illustrated in FIG. 3, can be provided at the first outer portion and the second outer portion, facing each other in the first direction Y, of the outer portions surrounding the first pixels 1P and the second pixels 2P.

For example, in FIG. 3, a left outer portion of the outer portions surrounding the first pixels 1P and the second pixels 2P can be the first outer portion, a right outer portion can be the second outer portion, an upper outer portion can be a third outer portion, and a lower outer portion can be a fourth outer portion.

In this case, the first outer portion and the second outer portion can be arranged in the first direction Y and can be provided to face each other. The third outer portion and the fourth outer portion can be arranged in the second direction X and can be provided to face each other.

The first pixels 1P, the second pixels 2P, and the third pixels 3P can be repeatedly arranged in the second direction X vertical to the first direction Y.

For example, as illustrated in FIG. 3, other first pixels 1P' can be provided at right sides of the third pixels 3P, other second pixels 2P' can be provided at right sides of the other first pixels 1P', and other third pixels 3P' can be provided at right sides of the other second pixels 2P'.

Moreover, other third pixels 3P" can be provided at left sides of the first pixels 1P, other second pixels 2P" can be provided at left sides of the other third pixels 3P", and other first pixels 1P'" can be provided at left sides of the other second pixels 2P".

Therefore, the first emission layer wall 1EW and the second emission layer wall 2EW can be repeatedly arranged in the second direction X in the light emitting display panel 100.

The number and arrangement structure of the pixels P provided in the display area AA can be variously modified.

Hereinafter, for convenience of description, the light emitting display panel 100 where twelve pixels are arranged in the first direction Y will be described as an example of the present disclosure. Also, details of the first emission layer wall 1EW and the second emission layer wall 2EW described below can be identically applied to all first emission layer walls 1EW and second emission layer walls 2EW included in the light emitting display panel 100. Also, details of the second emission layer wall 2EW can be identically applied to the first emission layer wall 1EW.

The main emission layer MEL can be provided in the first pixels 1P and the second pixels 2P and can be covered by the main cathode MCE.

For example, as described above, a light emitting device ED can include a first electrode, a second electrode, and an emission layer. In the following description, the first electrode can be referred to as an anode AE, and the second electrode can be referred to as a cathode CE.

In this case, emission layers including the same material can be provided in the first pixels 1P and the second pixels 2P. A first color filter can be disposed on the first pixels 1P. A second color filter can be disposed on the second pixels 2P.

The first color filter can be a red color filter, and the second color filter can be a green color filter.

In the following description, each of emission layers which include the same material and are provided in the first pixels 1P and the second pixels 2P can be referred to as a main emission layer MEL. Also, each of cathodes provided in the first pixels 1P and the second pixels 2P can be referred to as a main cathode MCE.

The sub emission layer SEL can be provided in the third pixels 3P and can be covered by the sub-cathode SCE. In this case, unlike the first pixels 1P and the second pixels 2P, a color filter may not be provided on the third pixels 3P.

However, color filters emitting lights of different colors can be respectively provided in the first to third pixels 1P to 3P.

In the following description, an emission layer provided in the third pixels 3P can be referred to as a sub emission layer SEL. Also, a cathode provided in the third pixels 3P can be referred to as a sub-cathode SCE.

However, a generic name for the main emission layer MEL and the sub emission layer SEL provided in the light emitting display panel 100 can be referred to as an emission layer EL, and a generic name for the main cathode MCE and the sub-cathode SCE can be referred to as a cathode CE.

Finally, the main cathode MCE and the sub-cathode SCE can be divided in the second emission layer wall 2EW, and the main cathode MCE and the sub-cathode SCE can be connected with each other in at least one of the other outer portions except the first outer portion and the second outer portion.

For example, as illustrated in FIG. 3, the main cathodes MCE provided in the first pixels 1P and the second pixels 2P and the sub-cathode SCE provided in the third pixels 3P can be divided with the second emission layer wall 2EW therebetween.

However, a structure material corresponding to the first emission layer wall 1EW and the second emission layer wall 2EW may not be provided at the other outer portions (for example, a third outer portion provided at an end of each of the first pixels 1P and the second pixels 2P and a fourth outer portion provided at a lower end of each of the first pixels 1P and the second pixels 2P) except the first outer portion and the second outer portion surrounding the first pixels 1P and the second pixels 2P.

Therefore, the main cathode MCE and the sub-cathode SCE can be connected with each other at the third outer portion and the fourth outer portion.

In the light emitting display panel 100 having a structure described above, as illustrated in FIG. 3, the emission layer EL can be provided in a region which is greater than the display area AA, and the cathode CE can be provided in a region which is greater than the emission layer EL.

Accordingly, ends of the emission layer EL can be provided in the non-display area NAA, and ends of the cathode CE can also be provided in the non-display areas NAA.

Moreover, both ends of the first emission layer wall 1EW can be provided in the non-display area NAA, and both ends of the second emission layer wall 2EW can be provided in the non-display area NAA. In this case, the both ends of the first emission layer wall 1EW and the second emission layer wall 2EW can be provided at the ends of the emission layer EL. Accordingly, the both ends of the first emission layer wall 1EW and the second emission layer wall 2EW can be covered by the cathode CE.

Moreover, as described above, another third pixel 3P" can be provided at a left side of the first pixel 1P, and the first emission layer wall 1EW can be provided between the first pixel 1P and the other third pixel 3P".

In this case, the main cathode MCE and another sub-cathode SCE provided in the other third pixel 3P" can be divided by the first emission layer wall 1EW, and the other sub-cathode SCE and the main cathode MCE can be connected with each other through the third outer portion and the fourth outer portion.

For example, the first emission layer wall 1EW can perform a function of separating the sub-cathode SCE from the main cathode MCE, and thus, the first emission layer wall 1EW can perform the same function as that of the second emission layer wall 2EW. Hereinafter, therefore, for convenience of description, the present disclosure will be described with reference to the second emission layer wall 2EW. Accordingly, details of the second emission layer wall 2EW described below can be identically applied to the first emission layer wall 1EW.

A detailed structure of the first emission layer wall 1EW and the second emission layer wall 2EW will be described below with reference to FIGS. 4 and 5. Hereinafter, particularly, the present disclosure will be described with reference to the first to third pixels 1P to 3P, the first emission layer wall 1EW, and the second emission layer wall 2EW provided in a region where line A-A' and line B-B' are illustrated in FIG. 3.

Figure 4:
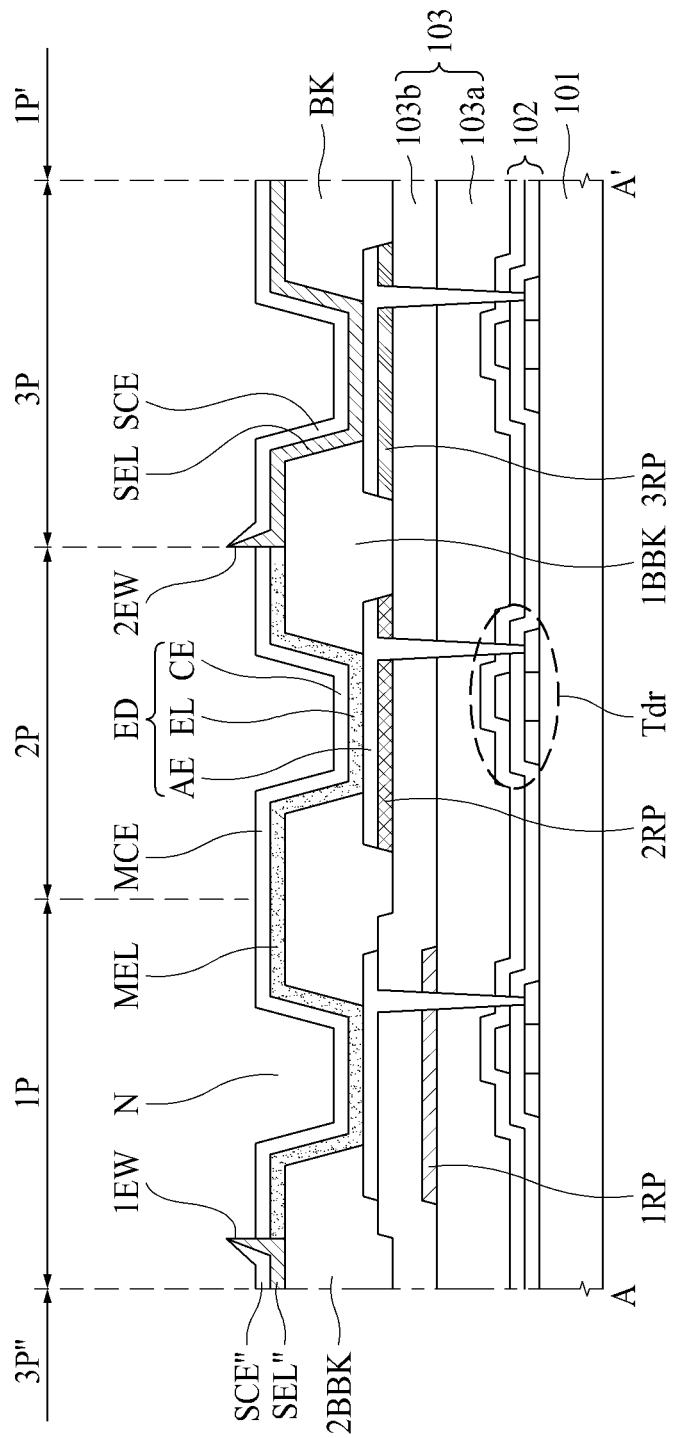
FIG. 4 is an exemplary diagram illustrating a cross-sectional surface taken along line A-A' illustrated in FIG. 3.
Figure 5:
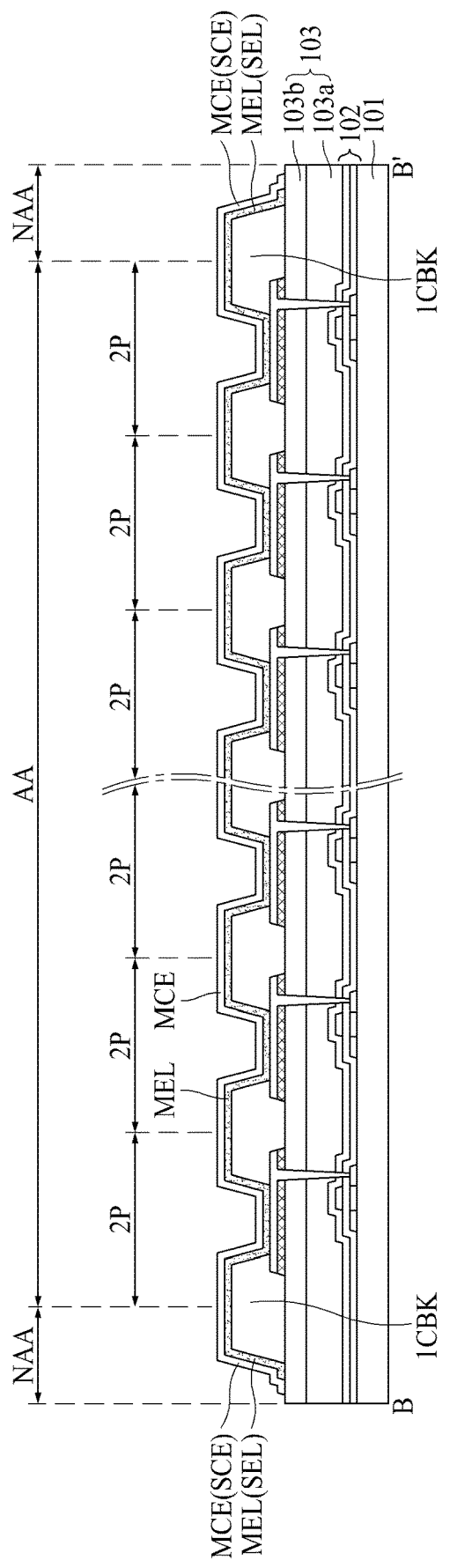
FIG. 5 is an exemplary diagram illustrating a cross-sectional surface taken along line B-B' illustrated in FIG. 3.

FIG. 4 is an exemplary diagram illustrating a cross-sectional surface taken along line A-A' illustrated in FIG. 3, and FIG. 5 is an exemplary diagram illustrating a cross-sectional surface taken along line B-B' illustrated in FIG. 3. More specifically, FIGS. 4 and 5 are exemplary diagrams illustrating a cross-sectional structure of the light emitting display panel 100.

First, as illustrated in FIGS. 4 and 5, the light emitting display panel can include a substrate 101, a circuit layer 102 provided on the substrate 101, a planarization layer 103 covering the circuit layer 102, anodes AE provided on the planarization layer 103, a bank BK including an opening portion N at which the anodes AE are exposed, the emission layer EL covering the anodes AE and the bank BK, and the cathode CE covering the emission layer EL.

The substrate 101 can be a glass substrate, or can be a film which includes various kinds of synthetic resins such as polyimide.

Transistors and a capacitor configuring a pixel driving circuit PDC can be provided in the circuit layer 102. To this end, the circuit layer 102 can include at least two insulation layers and metals provided between the at least two insulation layers. A driving transistor Tdr provided in the circuit layer 102 can be connected with the anode AE.

The planarization layer 103 can perform a function of planarizing an upper surface of the circuit layer 102. The planarization layer 103 can be formed of at least one layer, and for example, as illustrated in FIGS. 4 and 5, can include a first planarization layer 103a and a second planarization layer 103b. The first planarization layer 103a can cover the circuit layer 102, and the second planarization layer 103b can cover the first planarization layer 103a.

In this case, a first reflector 1RP can be provided in a region, corresponding to an anode AE of the first pixel 1P, of an upper surface of the first planarization layer 103a, a second reflector 2RP can be provided in a region, corresponding to an anode AE of the second pixel 2P, of an upper surface of the second planarization layer 103b, and a third reflector 3RP can be provided in a region, corresponding to an anode AE of the third pixel 3P, of the upper surface of the second planarization layer 103b.

The first reflector 1RP, the second reflector 2RP, and the third reflector 3RP can perform a function of reflecting light, emitted from the emission layer EL, toward the cathode CE.

Arrangement positions of the first reflector 1RP, the second reflector 2RP, and the third reflector 3RP can be various changed based on characteristics of pixels.

Particularly, as described above, color filters of different colors can be provided in the first pixel 1P and the second pixel 2P, but in the present disclosure, color filters may not be provided in the first pixel 1P and the second pixel 2P. For example, by adjusting an interval between the anode AE and the first reflector 1RP and an interval between the anode AE and the second reflector 2RP, the first pixel 1P and the second pixel 2P can emit lights of different colors. Therefore, in the present disclosure, a color filter may not be provided in all of the first pixel 1P, the second pixel 2P, and the third pixel 3P.

The light emitting device ED can include the anode AE, the emission layer EL, and the cathode CE.

The bank BK can cover an upper end of the planarization layer 103 and can cover ends of the anodes AE. Opening portions N corresponding to the anodes AE can be provided in the bank BK, and the anodes AE can be exposed through the opening portions N.

An encapsulation layer can cover the cathode CE to protect the cathode CE. The encapsulation layer can be formed of at least one layer.

Each of the first emission layer wall 1EW and the second emission layer wall 2EW can include the same material as that of the sub emission layer SEL.

For example, because the first emission layer wall 1EW and the second emission layer wall 2EW extend from the sub emission layer SEL, the first emission layer wall 1EW and the second emission layer wall 2EW can include the same material as that of the sub emission layer SEL and can be formed through the same process as the sub emission layer SEL.

As described above, the sub emission layer SEL can denote an emission layer EL provided in the third pixel 3P, and an emission layer EL provided in each of the first pixel 1P and the second pixel 2P can denote a main emission layer MEL.

The second emission layer wall 2EW can be provided on an upper surface of a first boundary bank 1BBK provided between the second pixels 2P and the third pixels 3P, and the first emission layer wall 1EW can be provided on an upper surface of a second boundary bank 2BBK provided between the first pixels 1P and the other third pixels 3P".

For example, the second emission layer wall 2EW can be provided on the upper surface of the first boundary bank 1BBK, and the first emission layer wall 1EW can be provided on the upper surface of the second boundary bank 2BBK. To provide an additional description, a bank provided between the second pixel 2P and the third pixel 3P among the banks BK can be referred to as a first boundary bank 1BBK, and a bank provided between the first pixel 1P and the other third pixel 3P" can be referred to as a second boundary bank 2BBK.

Therefore, in the following description, the bank BK can be divided into the first boundary bank 1BBK and the second boundary bank 2BBK. However, in a case where the first boundary bank 1BBK and the second boundary bank 2BBK are not differentiated from each other, the present disclosure will be described by using the bank BK.

The second emission layer wall 2EW, as illustrated in FIG. 4, can protrude from an upper surface of the sub emission layer SEL, at an end of the sub emission layer SEL provided in the first boundary bank 1BBK. For example, the second emission layer wall 2EW can be connected with the end of the sub emission layer SEL, and particularly, can protrude in a direction vertical to the upper surface of the sub emission layer SEL, at the end of the sub emission layer SEL. An angle between the upper surface of the sub emission layer SEL and the second emission layer wall 2EW may not be perpendicular and can be variously changed based on a manufacturing process and a material used.

The second emission layer wall 2EW can be adjacent to the main emission layer MEL at an upper surface of the first boundary bank 1BBK. In this case, an upper surface of the sub emission layer SEL connected with the second emission layer wall 2EW can be formed in approximately parallel with an upper surface of the main emission layer MEL. Accordingly, the second emission layer wall 2EW can protrude to be higher than the upper surface of the main emission layer MEL.

In this case, the main cathode MCE provided in each of the first pixel 1P and the second pixel 2P and the sub-cathode SCE provided in the third pixel 3P can be divided in the second emission layer wall 2EW. For example, the main cathode MCE and the sub-cathode SCE can be divided based on a protrusion shape of the second emission layer wall 2EW.

The first emission layer wall 1EW, as illustrated in FIG. 4, can protrude from an upper surface of another sub emission layer SEL", at an end of the other sub emission layer SEL" provided in the second boundary bank 2BBK. For example, the first emission layer wall 1EW can be connected with the end of the other sub emission layer SEL", and particularly, can protrude in a direction vertical to an upper surface of the other sub emission layer SEL", at the end of the other sub emission layer SEL". An angle between the upper surface of the other sub emission layer SEL" and the first emission layer wall 1EW may not be perpendicular and can be variously changed based on a manufacturing process and a material used. The sub emission layer SEL provided in the first boundary bank 1BBK and the other sub emission layer SEL" provided in the second boundary bank 2BBK can be formed of the same material through the same process.

The first emission layer wall 1EW can be adjacent to the main emission layer MEL at an upper surface of the second boundary bank 2BBK. In this case, the upper surface of the other sub emission layer SEL" connected with the first emission layer wall 1EW can be formed in approximately parallel with the upper surface of the main emission layer MEL. Accordingly, the first emission layer wall 1EW can protrude to be higher than the upper surface of the main emission layer MEL.

In this case, the main cathode MCE provided in each of the first pixel 1P and the second pixel 2P and the other sub-cathode SCE" provided in the other third pixel 3P" can be divided in the first emission layer wall 1EW. For example, the main cathode MCE and the other sub-cathode SCE" can be divided based on a protrusion shape of the first emission layer wall 1EW.

In this case, another first pixel 1P' can be provided at a right side of the third pixel 3P illustrated in FIG. 4. Therefore, a bank BK provided at the right side of the third pixel 3P illustrated in FIG. 4 can perform the same function as that of the second boundary bank 2BBK provided at a left side of the first pixel 1P illustrated in FIG. 4. For example, the bank BK provided at the right side of the third pixel 3P illustrated in FIG. 4 can be another second boundary bank 2BBK. In this case, another first emission layer wall 1EW can be provided in the other second boundary bank 2BBK.

To provide an additional description, a relationship between the other first pixel 1P' and the third pixel 3P illustrated in FIG. 4 can be the same as a relationship between the other third pixel 3P'" and the first pixel 1P illustrated in FIG. 4.

Because the first emission layer wall 1EW is provided in each second boundary bank 2BBK and the second emission layer wall 2EW is provided in each first boundary bank 1BBK, the second boundary bank 2BBK and the first boundary bank 1BBK can be repeatedly arranged in the second direction X in the light emitting display panel 100 illustrated in FIG. 4.

Finally, as illustrated in FIG. 5, a first connection bank 1CBK can be provided in the non-display area NAA surrounding the display area AA, and particularly, can be provided in at least one of the other outer portions except the first outer portion and the second outer portion. In the light emitting display panel illustrated in FIGS. 3 to 5, the first pixels 1P and the second pixels 2P can be surrounded by the first emission layer wall 1EW provided at the first outer portion and the second emission layer wall 2EW provided at the second outer portion. However, other emission layer walls corresponding to the first emission layer wall 1EW and the second emission layer wall 2EW may not be provided at the third outer portion and the fourth outer portion. Accordingly, in the light emitting display panel illustrated in FIGS. 3 to 5, the first connection bank 1CBK can be provided at each of the first outer portion and the second outer portion.

The main emission layer MEL can be provided at an upper surface of the first connection bank, the main cathode MCE can be provided at the upper surface of the main emission layer MEL, and the main cathode MCE can be connected with the sub-cathode SCE in the non-display area NAA.

For example, as illustrated in FIG. 3, the main cathode MCE and the sub-cathode SCE can be connected with each other at the third outer portion and the fourth outer portion. Accordingly, the same voltage can be supplied to the first pixels 1P, the second pixels 2P, and the third pixels 3P through the main cathode MCE and the sub-cathode SCE.

Hereinafter, a method of manufacturing the light emitting display panel illustrated in FIG. 3 will be described with reference to FIGS. 3 to 7H.

FIGS. 6A to 6H and 7A to 7H are exemplary diagrams illustrating a method of manufacturing the light emitting display panel illustrated in FIG. 3. Particularly, FIGS. 6A to 6H illustrate cross-sectional surfaces taken along line A-A' illustrated in FIG. 3 in a process of manufacturing the light emitting display panel, and FIGS. 7A to 7H illustrate cross-sectional surfaces taken along line B-B' illustrated in FIG. 3 in a process of manufacturing the light emitting display panel.

Figure 6A:
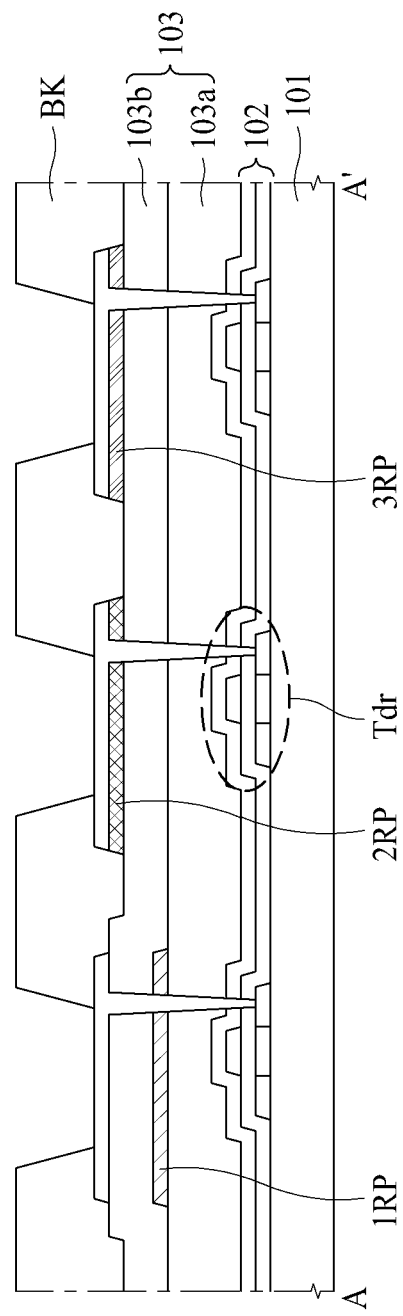
FIGS. 6A to 6H and 7A to 7H are exemplary diagrams illustrating a method of manufacturing the light emitting display panel illustrated in FIG. 3.
Figure 7A:
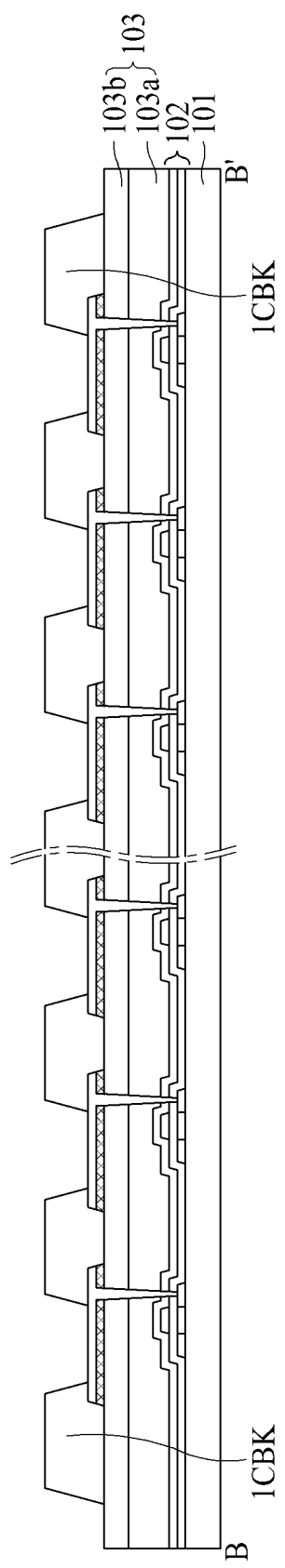

First, as illustrated in FIGS. 6A and 7A, the circuit layer 102 can be provided on the substrate 101, the circuit layer 102 can be covered by the planarization layer 103, the anodes AE can be provided on the planarization layer 103, and the bank BK can be provided to cover ends of the anodes AE. In this case, the reflectors 1RP to 3RP can be formed at various positions of the planarization layer 103.

Figure 6B:
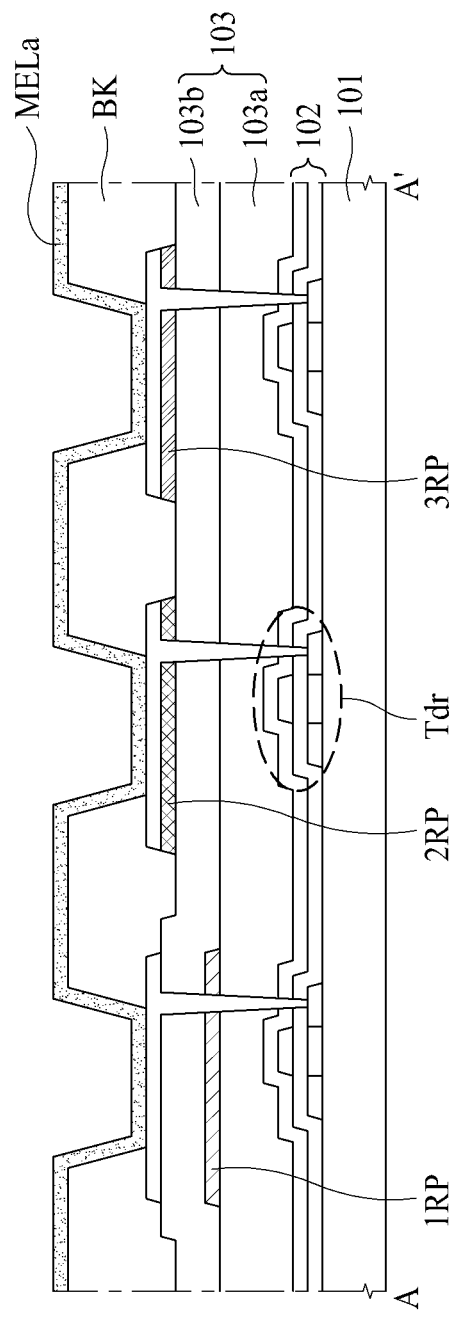
Figure 7B:
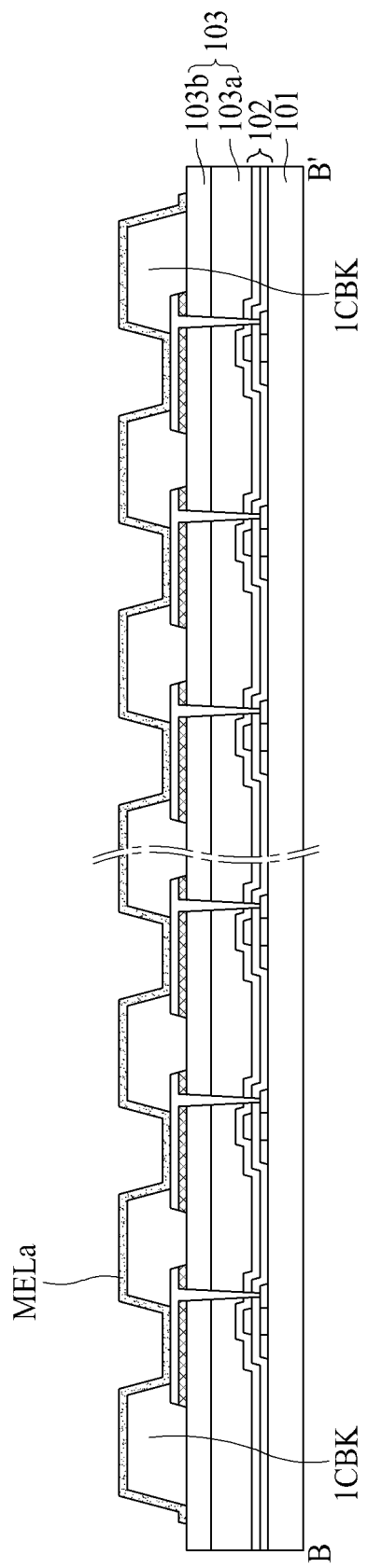

Subsequently, as illustrated in FIGS. 6B and 7B, a main emission layer material MELa configuring the main emission layer MEL can be deposited in the light emitting display panel. Accordingly, the banks BK and the anodes AE can be covered by the main emission layer material MELa.

Figure 6C:
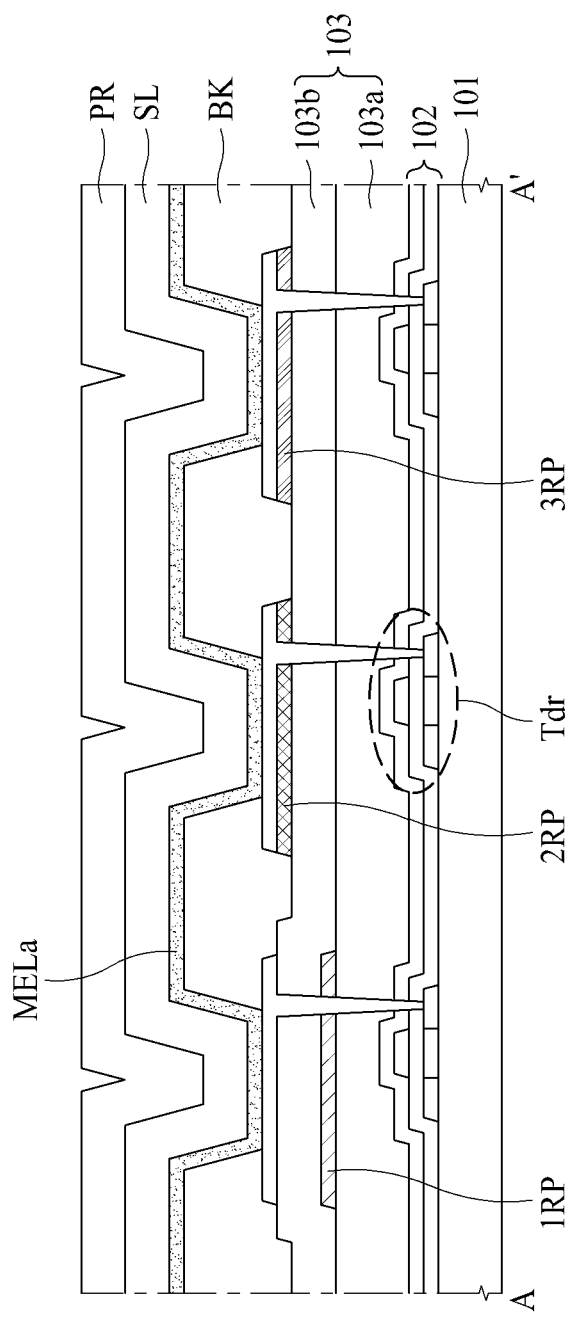
Figure 7C:
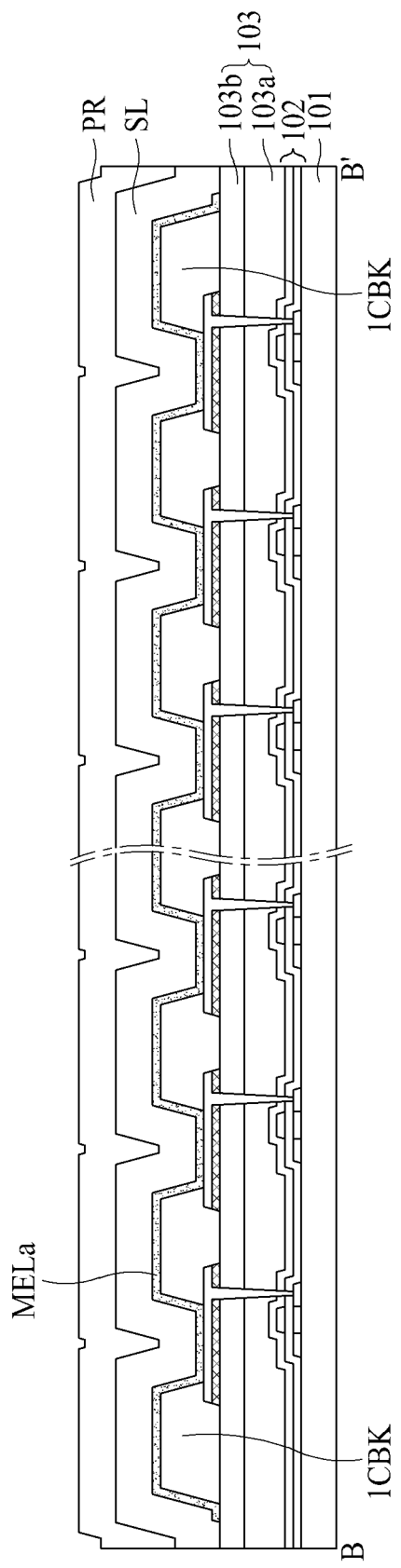
Figure 7D:
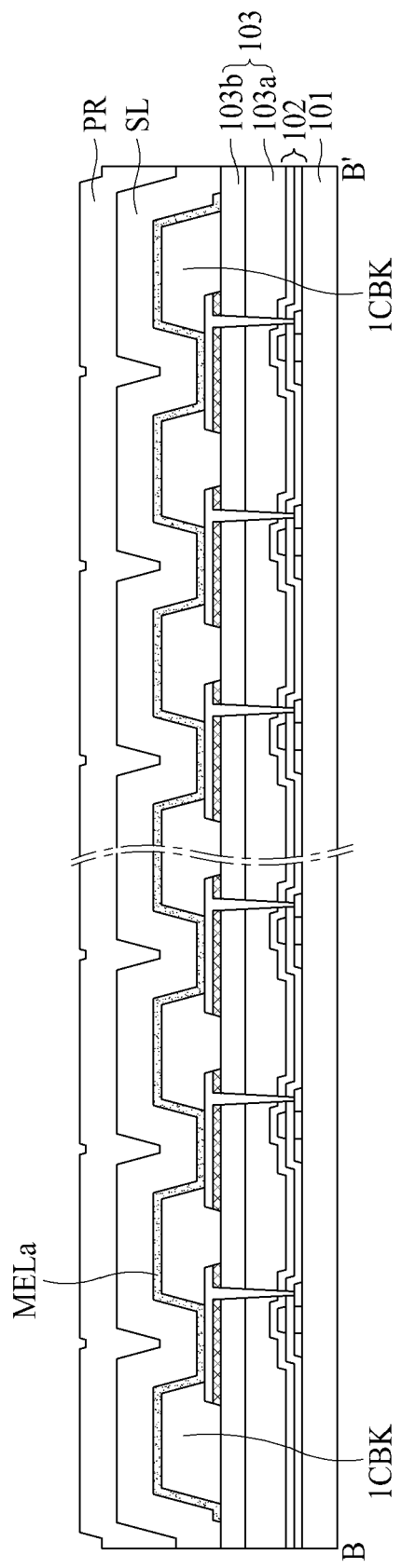
Figure 7E:
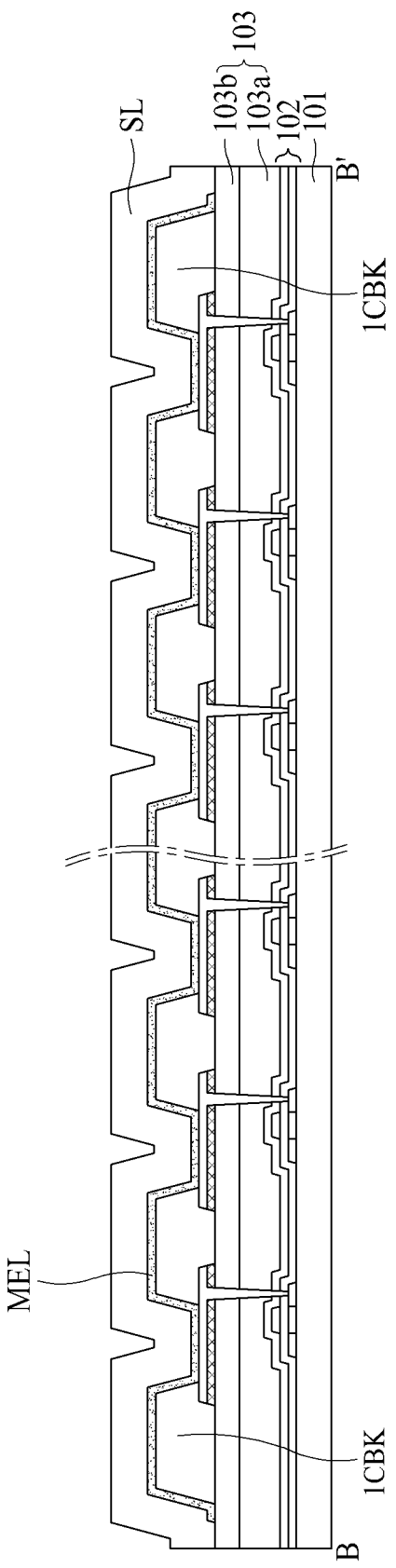

Subsequently, as illustrated in FIGS. 6C and 7C, the main emission layer material MELa can be covered by a shielding layer SL, and the shielding layer SL can be covered by a photoresist PR.

Here, the shielding layer SL can be a material which does not damage an organic layer despite being adjacent to the organic layer such as the main emission layer material MELa. For example, the shielding layer SL can include a water-based polymer material or a fluorine-based polymer material. For example, the water-based polymer material of the shielding layer SL can be a hydrophilic organic material such as polyethylene glycol (PEG), polyvinyl alcohol (PVA), or polyvinyl acetate (PVAc), and the fluorine-based polymer material can be a floropolymer material where a carbon-carbon bond is continuously formed in a chain structure and a high amount of fluorine (F) is included in a functional group (or a reactional group).

Figure 6D:
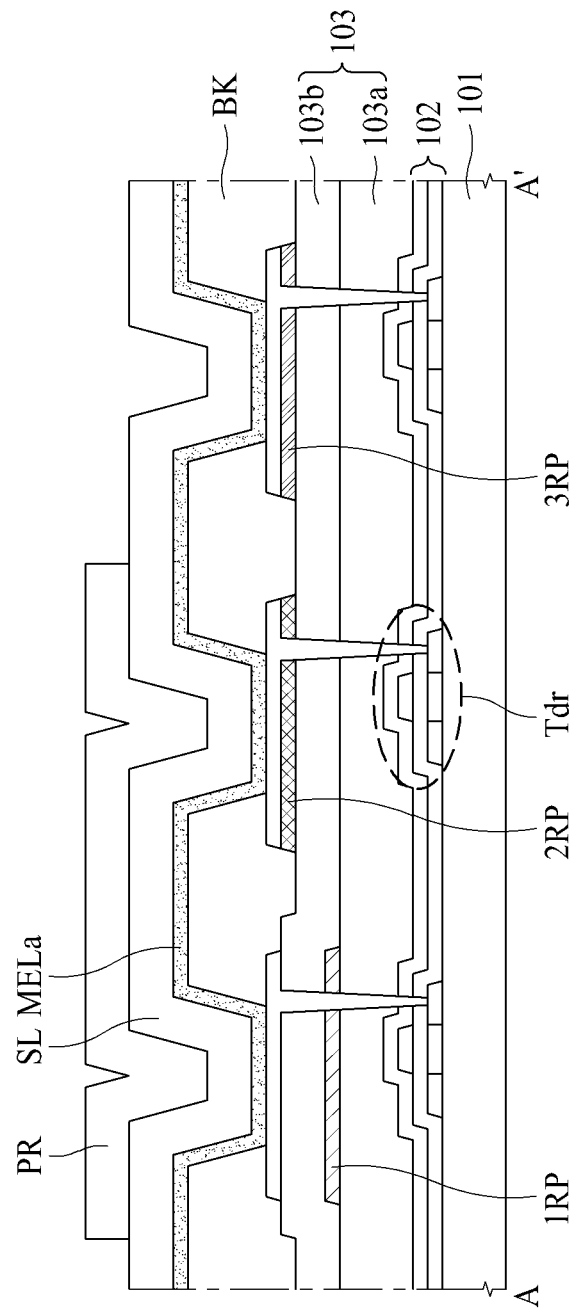

Subsequently, as illustrated in FIG. 6D, a photoresist PR provided in a region corresponding to the third pixel 3P can be removed through a development process. In this case, a photoresist PR provided in a region corresponding to the first pixel 1P and the second pixel 2P may not be removed. Accordingly, there can be no difference between FIG. 7D and FIG. 7C.

Figure 6E:
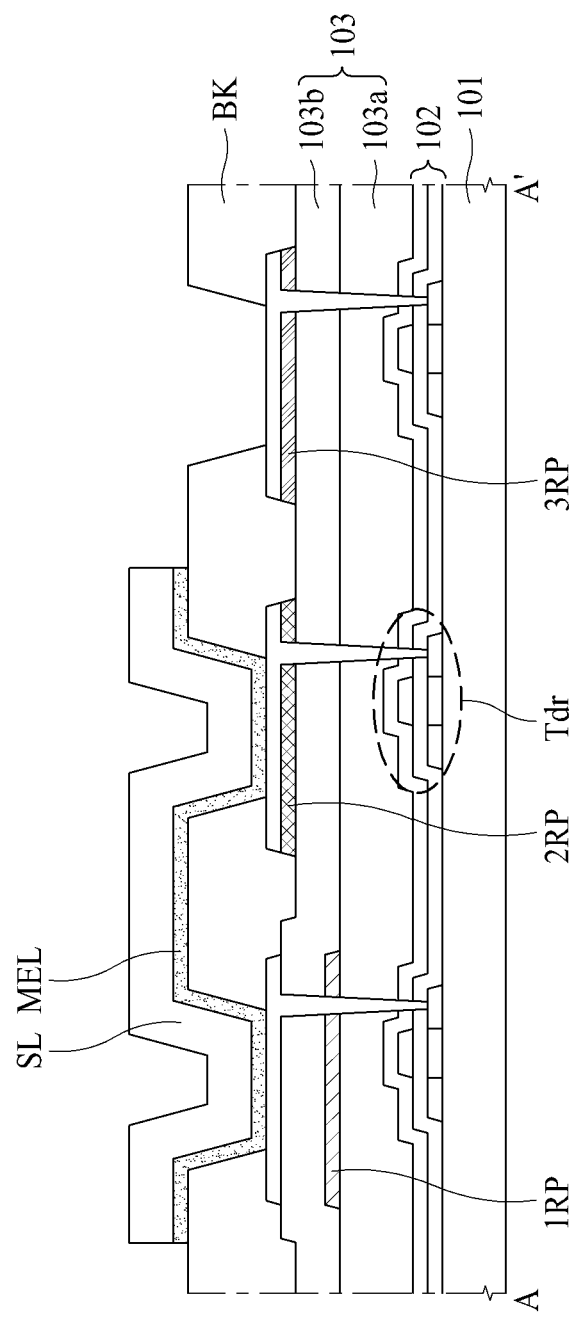

Subsequently, as illustrated in FIG. 6E, by using a residual photoresist PR as a mask, the shielding layer SL and the main emission layer material MELa can be etched. Therefore, the shielding layer SL and the main emission layer material MELa provided in a region corresponding to the third pixel 3P can be removed, and then, the photoresist PR can be removed. In this case, the shielding layer SL provided in a region corresponding to the first pixel 1P and the second pixel 2P may not be removed. Accordingly, in FIG. 7E, only the photoresist PR illustrated in FIG. 7D can be removed.

Figure 6F:
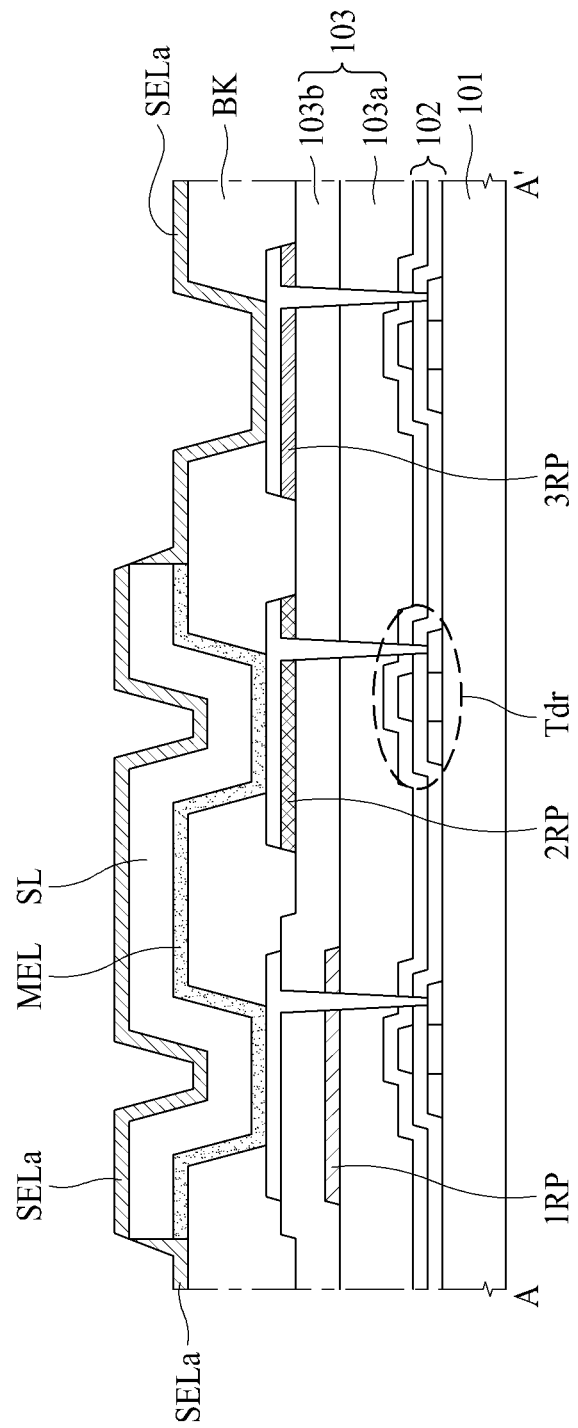
Figure 7F:
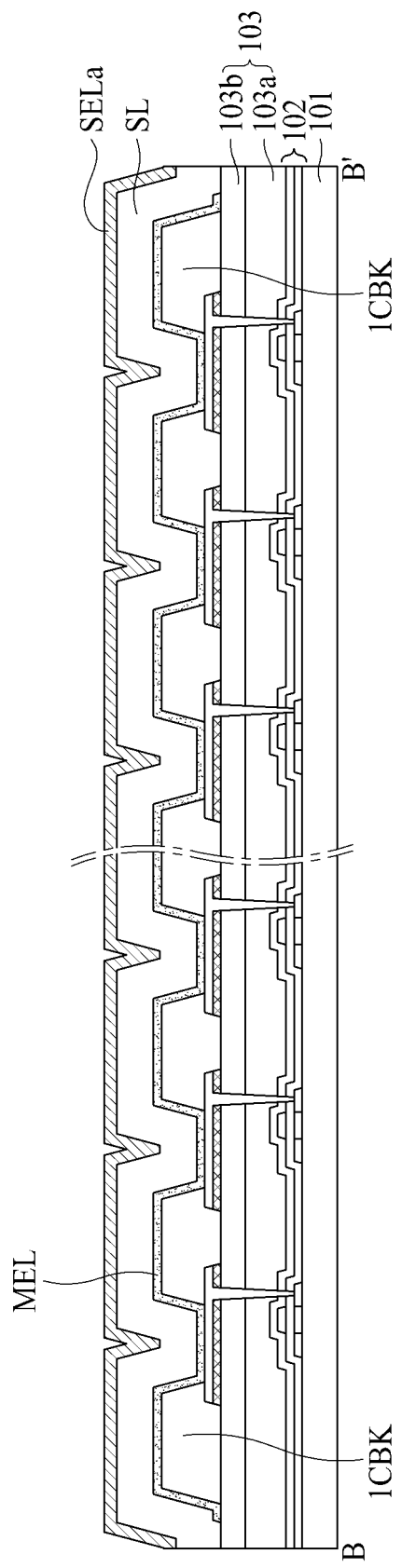

Subsequently, as illustrated in FIGS. 6F and 7F, a sub emission layer material SELa configuring the sub emission layer SEL can be deposited in the light emitting display panel. Accordingly, the bank and the anode AE of the third pixel 3P and the shielding layer SL can be covered by the sub emission layer material SELa.

Figure 6G:
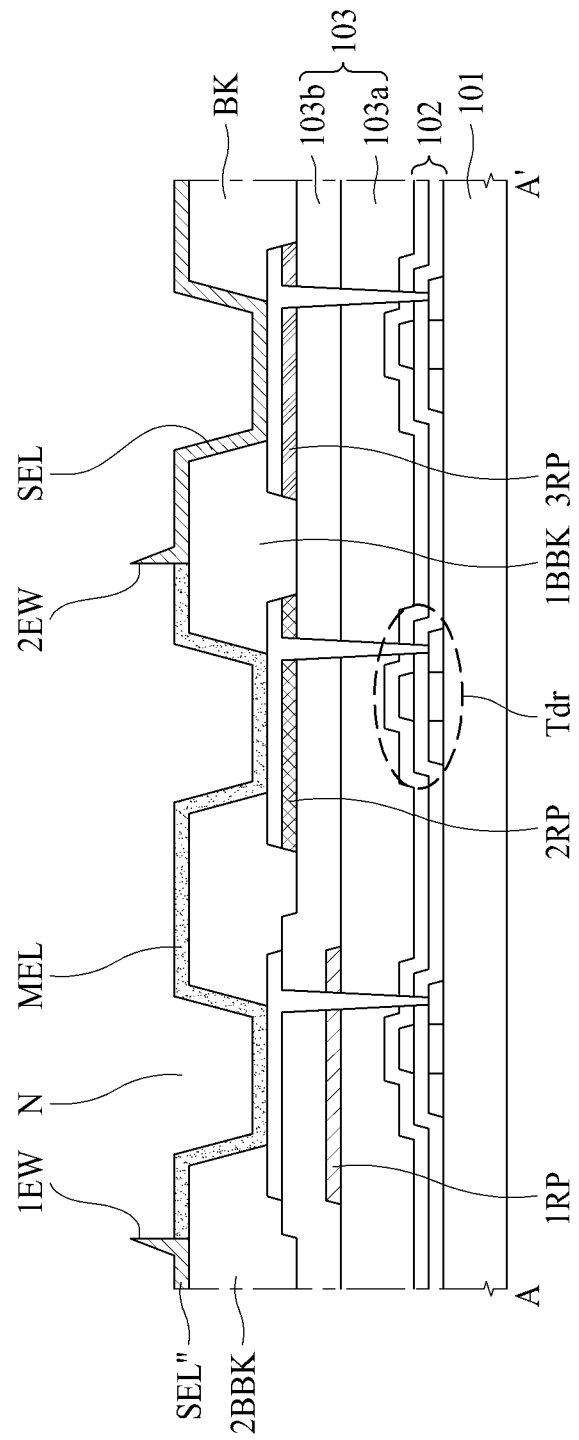
Figure 7G:
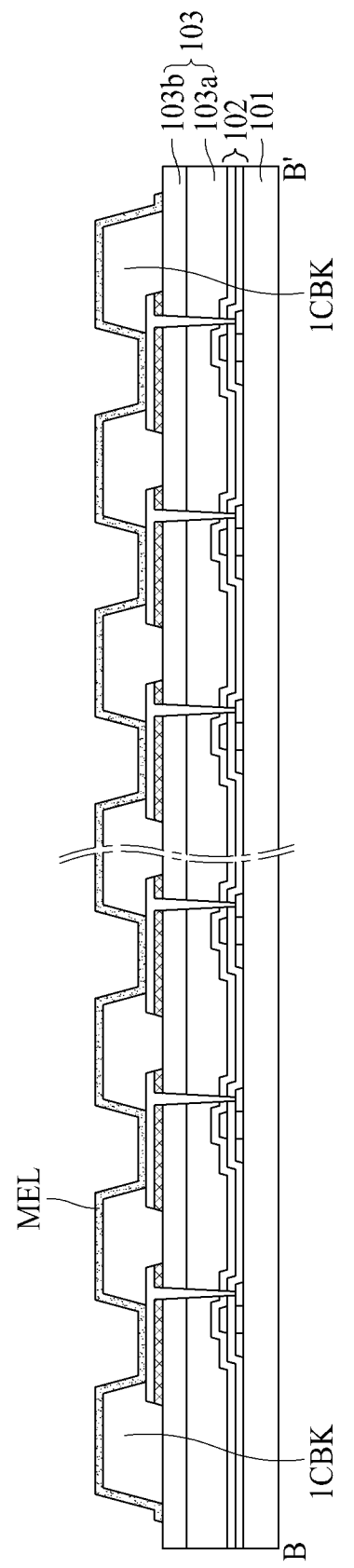

Subsequently, as illustrated in FIGS. 6G and 7G, the shielding layer SL can be removed. In this case, the sub emission layer material SELa can be provided on an upper surface and lateral surfaces of the shielding layer SL illustrated in FIG. 6F, and thus, when the shielding layer SL is removed, the sub emission layer material SELa provided at an upper end of the shielding layer SL can be removed together with the shielding layer SL. However, the sub emission layer material SELa provided on the lateral surface of the shielding layer SL can be intactly maintained in an original shape.

Therefore, as illustrated in FIG. 6G, the sub emission layer SEL can be formed in a region corresponding to the third pixel 3P, the second emission layer wall 2EW can be formed at the first boundary bank 1BBK, and the first emission layer wall 1EW can be formed at the second boundary bank 2BBK.

However, in FIG. 7F, the sub emission layer material SELa can be provided on only the shielding layer SL, and thus, when the shielding layer SL is removed, all of the sub emission layer material SELa provided on the shielding layer SL can be removed. Accordingly, in FIG. 7G, a sub emission layer SEL is not illustrated. That is, because a cross-sectional surface illustrated in FIG. 7G illustrates a cross-sectional surface of each of second pixels 2P, a sub emission layer SEL provided in a third pixel 3P is not illustrated in FIG. 7G.

Figure 6H:
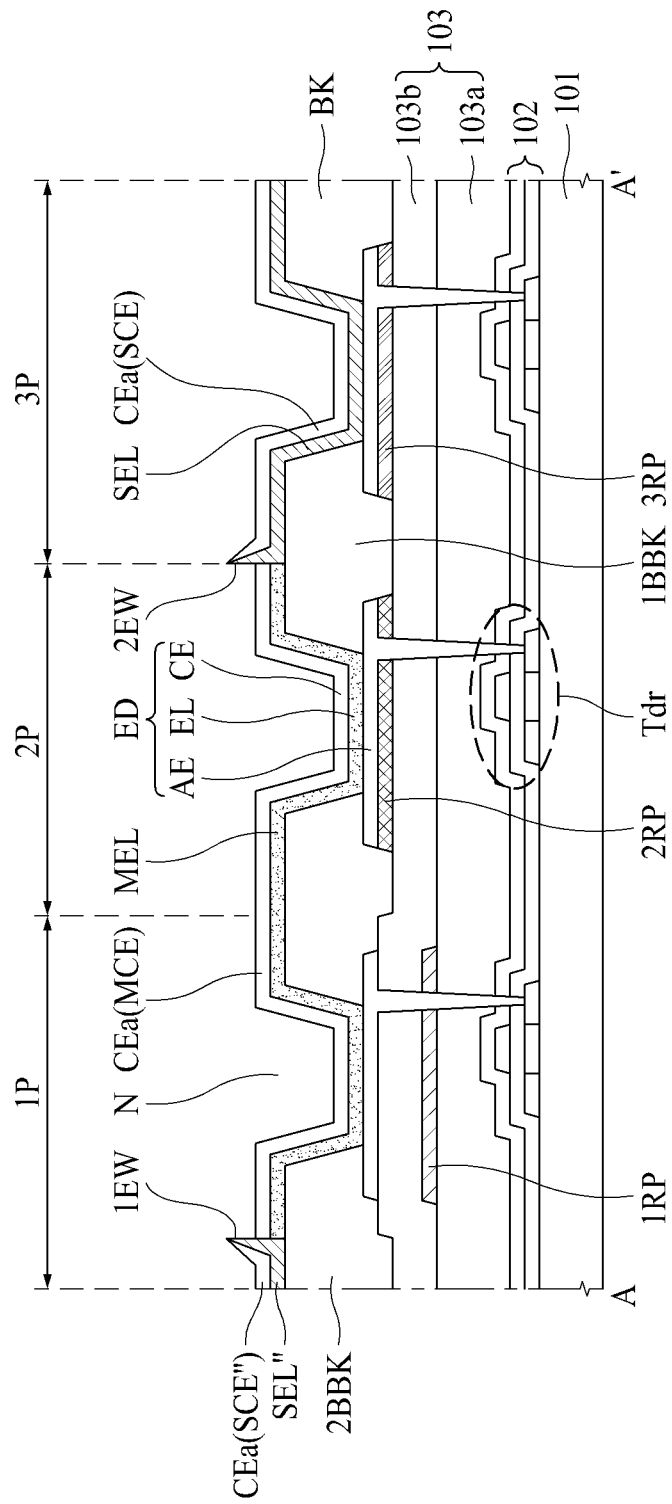
Figure 7H:
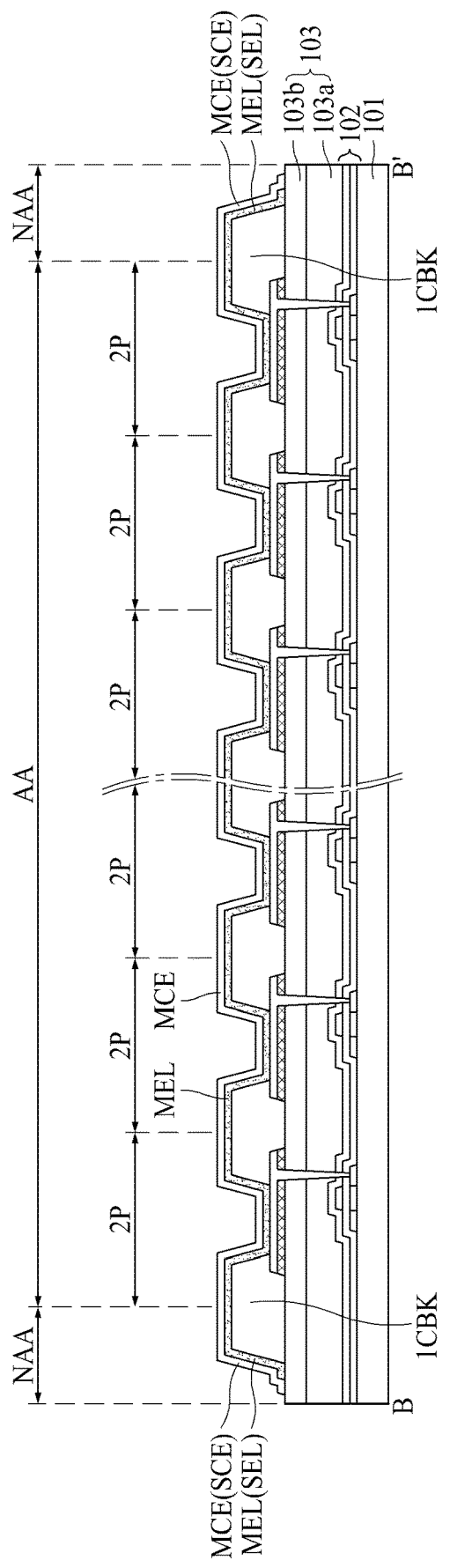

Finally, as illustrated in FIGS. 6H and 7H, a cathode material CEa included in the cathode CE can be deposited the light emitting display panel 100.

In this case, as illustrated in FIG. 6G, there can be a height difference between the first emission layer wall 1EW and the main emission layer MEL, and thus, the cathode material CEa can be divided by the first emission layer wall 1EW. Also, there can be a height difference between the second emission layer wall 2EW and the main emission layer MEL, and thus, the cathode material CEa can be divided by the second emission layer wall 2EW.

Therefore, as illustrated in FIG. 6H, the main cathode MCE and the sub cathode SCE can be divided by using the second emission layer wall 2EW as a boundary, and the main cathode MCE and the other sub cathode SCE' can be divided by using the first emission layer wall 1EW as a boundary.

However, as illustrated in FIG. 6G, because an emission layer wall corresponding to the first emission layer wall 1EW and the second emission layer wall 2EW is not provided at a cross-sectional surface taken along line B-B', the cathode material CEa can be continuously formed. Accordingly, the main cathode MCE can be continuously formed in the second pixels 2P.

In this case, as described above with reference to FIGS. 3 to 5, the main cathode MCE and the sub-cathode SCE can be connected with each other at the third outer portion and the fourth outer portion. For example, the main cathode MCE and the sub-cathode SCE can be connected with each other at a left end and a right end of FIG. 7H. Accordingly, the same voltage can be supplied to the first pixels 1P, the second pixels 2P, and the third pixels 3P through the main cathode MCE and the sub-cathode SCE.

Figure 8:
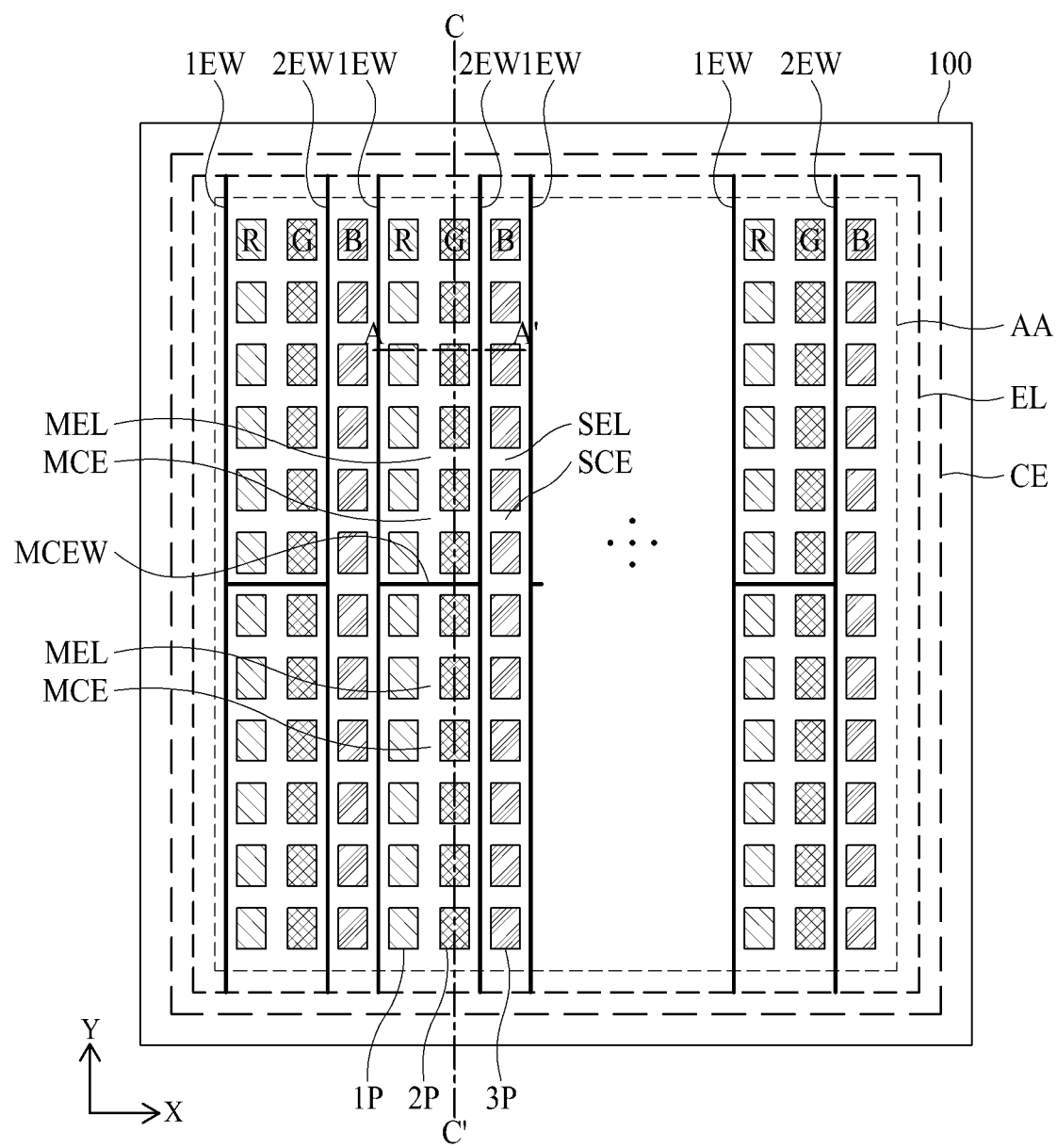
FIG. 8 is another exemplary diagram illustrating a one-dimensional configuration of a light emitting display panel applied to a light emitting display apparatus according to an embodiment of the present disclosure.
Figure 9:
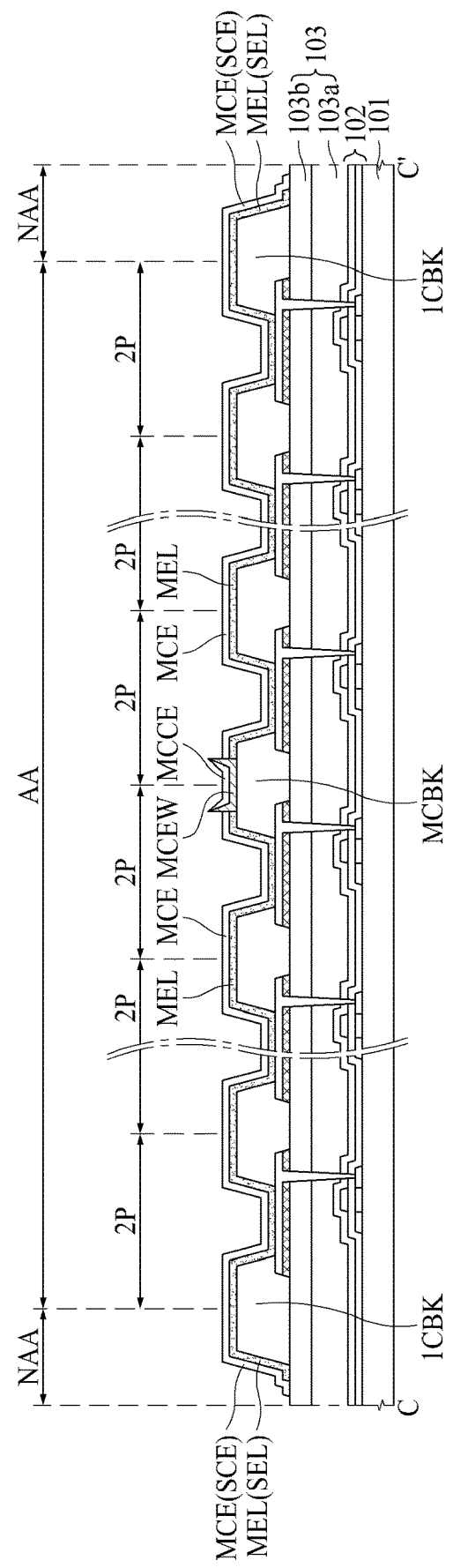
FIG. 9 is an exemplary diagram illustrating a cross-sectional surface taken along line C-C' illustrated in FIG. 8.

FIG. 8 is another exemplary diagram illustrating a one-dimensional configuration of a light emitting display panel applied to a light emitting display apparatus according to the present disclosure, and FIG. 9 is an exemplary diagram illustrating a cross-sectional surface taken along line C-C' illustrated in FIG. 8. More specifically, FIG. 8 is another exemplary diagram illustrating in detail a one-dimensional structure of the light emitting display panel 100 illustrated in FIG. 1. In the following description, descriptions which are the same as or similar to the descriptions of FIGS. 1 to 7H are omitted or will be briefly given.

A light emitting display panel 100, as illustrated in FIG. 8, can include first pixels 1P which are arranged in a first direction Y of a display area AA displaying an image, second pixels 2P which are arranged in parallel with the first pixels 1P in the first direction Y in the display area AA, third pixels 3P which are arranged in parallel with the second pixels 2P in the first direction Y in the display area AA, a first emission layer wall 1EW and a second emission layer wall 2EW which are provided at a first outer portion and a second outer portion, facing each other in the first direction Y, of outer portions surrounding the first pixels 1P and the second pixels 2P, a main cathode MCE which covers an upper end of a main emission layer MEL provided in the first pixels 1P and the second pixels 2P, and a sub-cathode SCE which covers an upper end of a sub emission layer SEL provided in the third pixels 3P. The main cathode MCE and the sub-cathode SCE can be divided in the second emission layer wall 2EW, and the main cathode MCE can be connected with the sub-cathode SCE in at least one of the other outer portions except the first outer portion and the second outer portion.

In this case, comparing with the light emitting display panel illustrated in FIG. 3, the light emitting display panel 100 illustrated in FIG. 8 can further include a main connection emission layer wall MCEW. The main connection emission layer wall MCEW can be provided in the display area AA and can be connected with the first emission layer wall 1EW and the second emission layer wall 2EW.

For example, the main connection emission layer wall MCEW connected with the first emission layer wall 1EW and the second emission layer wall 2EW can be provided between the first emission layer wall 1EW and the second emission layer wall 2EW facing each other.

The main cathode MCE and the sub-cathode SCE can be connected with each other at each of the other outer portions (for example, a third outer portion and a fourth outer portion) except the first outer portion and the second outer portion. A structure and a method, where the main cathode MCE and the sub-cathode SCE are connected with each other at each of the third outer portion and the fourth outer portion, have been described above with reference to FIGS. 3 to 7, and thus, detailed descriptions thereof are omitted.

The main cathode MCE can be divided by the main connection emission layer wall MCEW.

For example, as illustrated in FIG. 9, the main connection emission layer wall MCEW can be provided on an upper surface of a main connection bank MCBK of banks provided between the second pixels 2P (or the first pixels 1P) arranged in the first direction Y.

The main connection emission layer wall MCEW can be formed of the same material as that of each of the first emission layer wall 1EW and the second emission layer wall 2EW through the same process.

The main connection emission layer wall MCEW can protrude to be higher than an upper surface of the main emission layer MEL at an upper surface of the main connection bank MCBK, and a center portion thereof can be formed to be concave.

Therefore, the main cathode MCE can be divided into two regions by the main connection emission layer wall MCEW. For example, a main connection cathode MCCE can be provided on an upper surface of the main connection emission layer wall MCEW, and the main cathodes MCE and the main connection cathode MCCE can be divided. Accordingly, the main cathodes MCE can be divided into two regions.

A plurality of main connection emission layer walls MCEW, as illustrated in FIG. 8, can be arranged in one row in a second direction, or can be arranged to be staggered. For example, an arrangement structure of the main connection emission layer walls MCEW can be variously changed based on a characteristic of a panel.

In this case, a cross-sectional surface taken along line A-A' illustrated in FIG. 8 can be the same as the cross-sectional surface taken along line A-A' illustrated in FIG. 3. For example, the cross-sectional surface taken along line A-A' illustrated in FIG. 8 can be the same as the cross-sectional surface illustrated in FIG. 4. Accordingly, detailed descriptions thereof are omitted.

Figure 10:
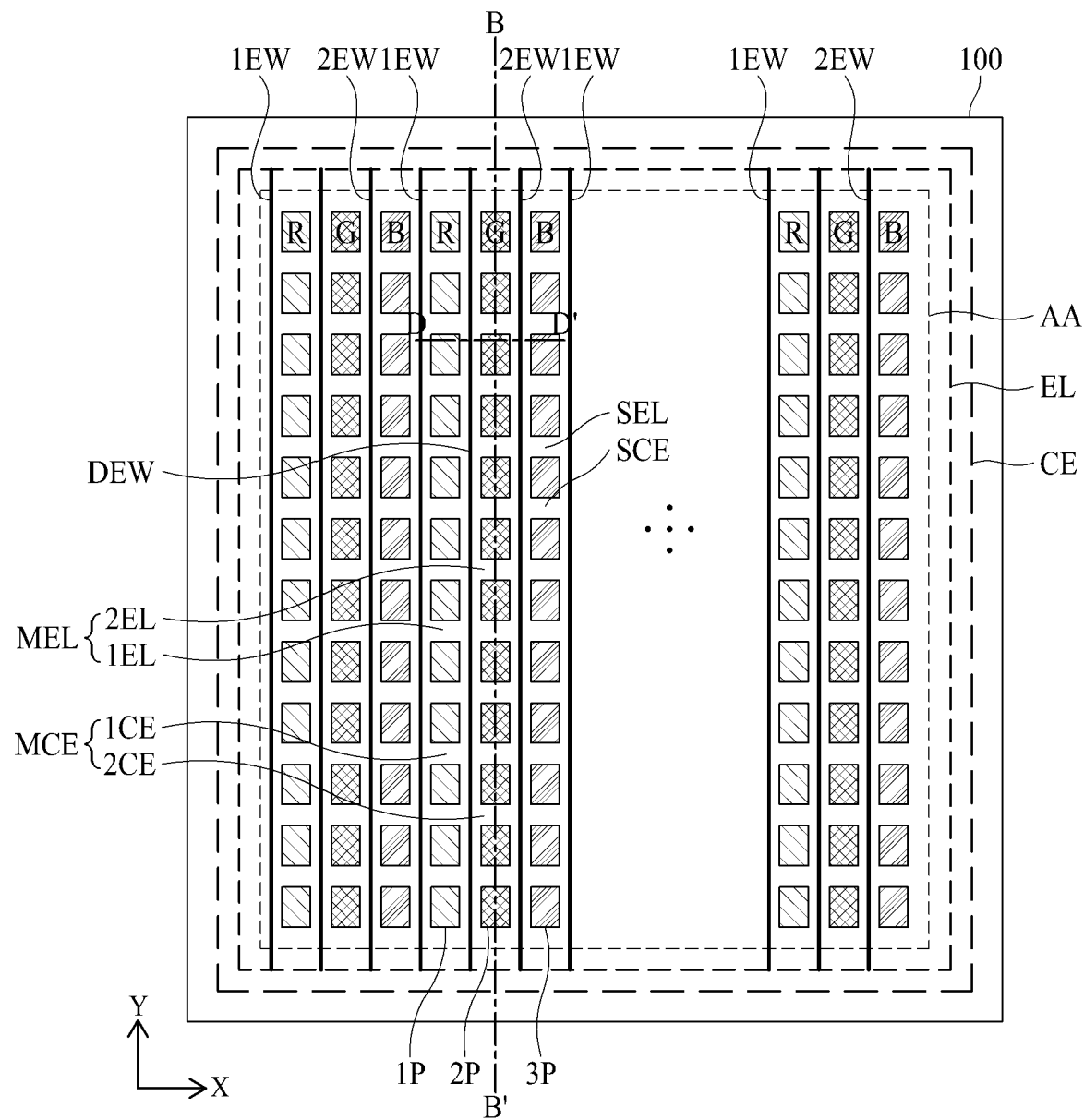
FIG. 10 is another exemplary diagram illustrating a one-dimensional configuration of a light emitting display panel applied to a light emitting display apparatus according to an embodiment of the present disclosure.
Figure 11:
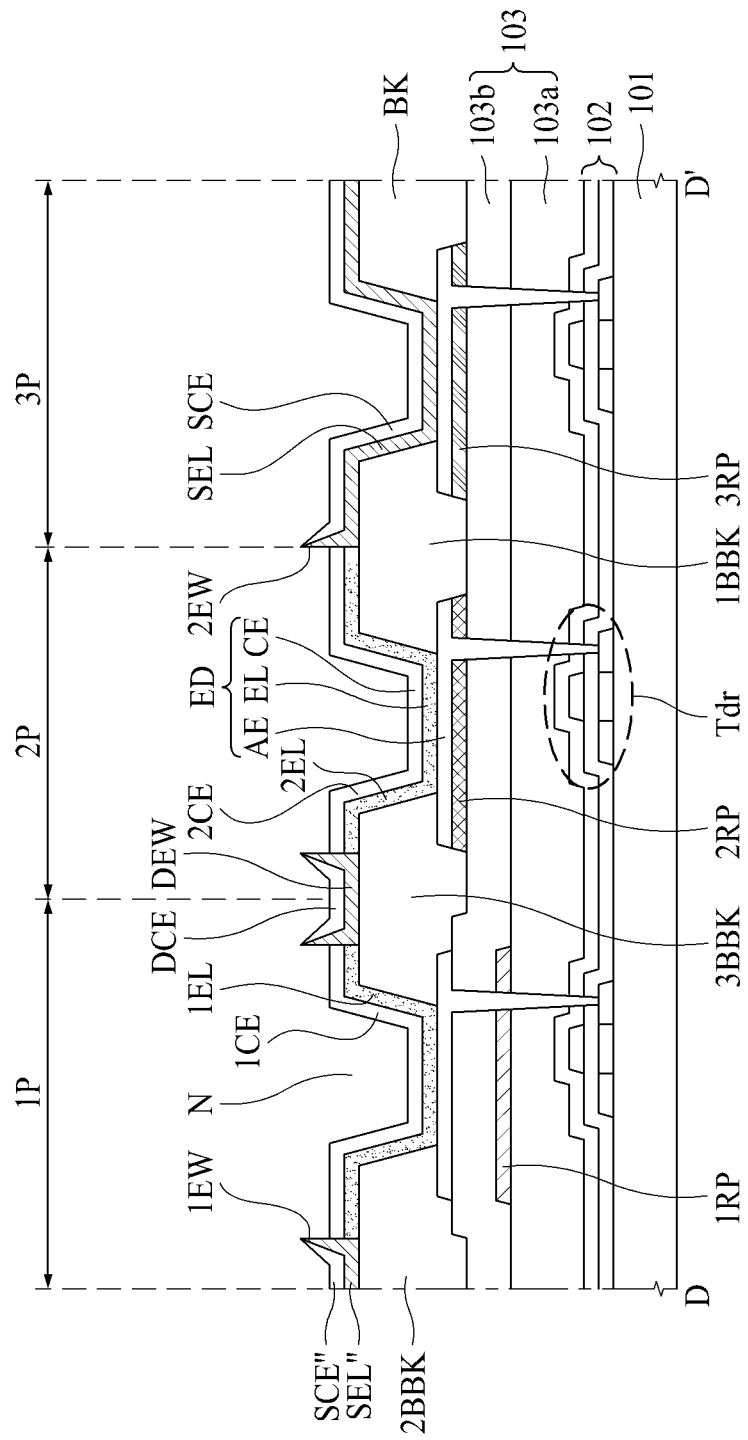
FIG. 11 is an exemplary diagram illustrating a cross-sectional surface taken along line D-D' illustrated in FIG. 10.

FIG. 10 is another exemplary diagram illustrating a one-dimensional configuration of a light emitting display panel applied to a light emitting display apparatus according to the present disclosure, and FIG. 11 is an exemplary diagram illustrating a cross-sectional surface taken along line D-D' illustrated in FIG. 10. More specifically, FIG. 10 is another exemplary diagram illustrating in detail a one-dimensional structure of the light emitting display panel 100 illustrated in FIG. 1. In the following description, descriptions which are the same as or similar to the descriptions of FIGS. 1 to 9 are omitted or will be briefly given.

A light emitting display panel 100, as illustrated in FIG. 10, can include first pixels 1P which are arranged in a first direction Y of a display area AA displaying an image, second pixels 2P which are arranged in parallel with the first pixels 1P in the first direction Y in the display area AA, third pixels 3P which are arranged in parallel with the second pixels 2P in the first direction Y in the display area AA, a first emission layer wall 1EW and a second emission layer wall 2EW which are provided at a first outer portion and a second outer portion, facing each other in the first direction Y, of outer portions surrounding the first pixels 1P and the second pixels 2P, a main cathode MCE which covers an upper end of a main emission layer MEL provided in the first pixels 1P and the second pixels 2P, and a sub-cathode SCE which covers an upper end of a sub emission layer SEL provided in the third pixels 3P. The main cathode MCE and the sub-cathode SCE can be divided in the second emission layer wall 2EW, and the main cathode MCE can be connected with the sub-cathode SCE in at least one of the other outer portions except the first outer portion and the second outer portion.

In this case, comparing with the light emitting display panel illustrated in FIG. 3, the light emitting display panel 100 illustrated in FIG. 10 can further include a division emission layer wall DEW. The division emission layer wall DEW can be provided in the first direction Y between the first pixels 1P and the second pixels 2P and can be provided in parallel with the first emission layer wall 1EW and the second emission layer wall 2EW.

For example, the division emission layer wall DEW provided in parallel with the first emission layer wall 1EW and the second emission layer wall 2EW can be provided between the first emission layer wall 1EW and the second emission layer wall 2EW facing each other.

The main cathode MCE and the sub-cathode SCE can be connected with each other at each of the other outer portions (for example, a third outer portion and a fourth outer portion) except the first outer portion and the second outer portion. A structure and a method, where the main cathode MCE and the sub-cathode SCE are connected with each other at each of the third outer portion and the fourth outer portion, have been described above with reference to FIGS. 3 to 7H, and thus, detailed descriptions thereof are omitted.

The main emission layer MEL can include a first emission layer 1EL provided in the first pixels 1P and a second emission layer 2EL provided in the second pixels 2P.

The main cathode MCE can include a first cathode 1CE covering an upper end of the first emission layer 1EL and a second cathode 2CE covering an upper end of the second emission layer 2EL.

The first cathode 1CE and the second cathode 2CE can be divided in the division emission layer wall DEW.

A structure and a principle, where the first cathode 1CE and the second cathode 2CE are divided by the division emission layer wall DEW, can be the same as a structure and a principle, where the main cathode MCE and the sub-cathode SCE are divided by the first emission layer wall 1EW or the second emission layer wall 2EW.

For example, as illustrated in FIG. 11, the division emission layer wall DEW can be provided on an upper surface of a third boundary bank 3BBK provided between the first pixel 1P and the second pixel 2P.

The division emission layer wall DEW can be formed of the same material as that of each of the first emission layer wall 1EW and the second emission layer wall 2EW through the same process.

The division emission layer wall DEW can protrude to be higher than the first emission layer 1EL and the second emission layer 2EL at the upper surface of the third boundary bank 3BBK. In this case, a center portion of the division emission layer wall DEW can be formed to be concave.

Therefore, the first cathode 1CE and the second cathode 2CE can be divided by the division emission layer wall DEW.

A division cathode DCE including the same material as that of the first cathode 1CE and the second cathode 2CE can be provided on the upper surface of the division emission layer wall DEW.

For example, in a state where the division emission layer wall DEW is formed, when a cathode material CEa is deposited in the first pixels 1P and the second pixels 2P, the first cathode 1CE and the second cathode 2CE separated from each other by the division emission layer wall DEW can be formed, and the division cathode DCE separated from the first cathode 1CE and the second cathode 2CE can be provided on the upper surface of the division emission layer wall DEW.

In this case, the first cathode 1CE and the second cathode 2CE can be connected with each other at each of the other outer portions (for example, a third outer portion and a fourth outer portion) except the first outer portion and the second outer portion.

A structure and a principle, where the first cathode 1CE and the second cathode 2CE are connected with each other at each of the third outer portion and the fourth outer portion, can be the same as a structure and a principle, where the main cathode MCE and the sub-cathode SCE are connected with each other at each of the third outer portion and the fourth outer portion.

In this case, a cross-sectional surface taken along line B-B' illustrated in FIG. 10 can be the same as the cross-sectional surface taken along line B-B' illustrated in FIG. 3. More specifically, the cross-sectional surface taken along line B-B' illustrated in FIG. 10 can be the same as the cross-sectional surface illustrated in FIG. 5. Accordingly, detailed descriptions thereof are omitted.

FIGS. 12A to 12E are exemplary diagrams illustrating a method of manufacturing the light emitting display panel illustrated in FIG. 10. Particularly, FIGS. 12A to 12E illustrate cross-sectional surfaces taken along line D-D' illustrated in FIG. 10 in a process of manufacturing the light emitting display panel. A method of manufacturing the light emitting display panel illustrated in FIG. 10 can be approximately the same as the manufacturing method described above with reference to FIGS. 6A to 6H and 7A to 7H. A difference with the manufacturing method described above with reference to FIGS. 6A to 6H and 7A to 7H will be described below.

First, as illustrated in FIGS. 6A and 7A, the circuit layer 102 can be provided on the substrate 101, the circuit layer 102 can be covered by the planarization layer 103, the anodes AE can be provided on the planarization layer 103, and the bank BK can be provided to cover ends of the anodes AE.

Subsequently, as illustrated in FIGS. 6B and 7B, a main emission layer material MELa configuring the main emission layer MEL can be deposited in the light emitting display panel. Accordingly, the banks BK and the anodes AE can be covered by the main emission layer material MELa.

Subsequently, as illustrated in FIGS. 6C and 7C, the main emission layer material MELa can be covered by a shielding layer SL, and the shielding layer SL can be covered by a photoresist PR.

Figure 12A:
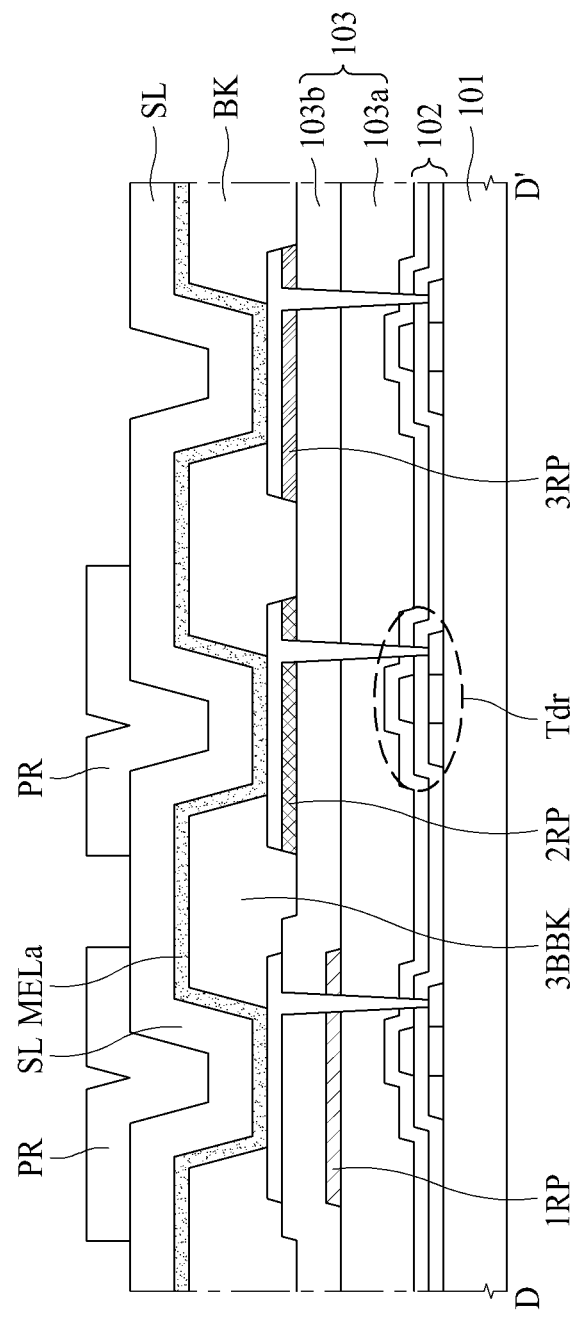
FIGS. 12A to 12E are exemplary diagrams illustrating a method of manufacturing the light emitting display panel illustrated in FIG. 10.

Subsequently, as illustrated in FIG. 12A, a photoresist PR provided in a region corresponding to the third pixel 3P and a photoresist PR provided on an upper surface of the third boundary bank 3BBK can be removed through a development process. In this case, a photoresist PR provided in a region corresponding to the first pixel 1P and the second pixel 2P may not be removed.

Figure 12B:
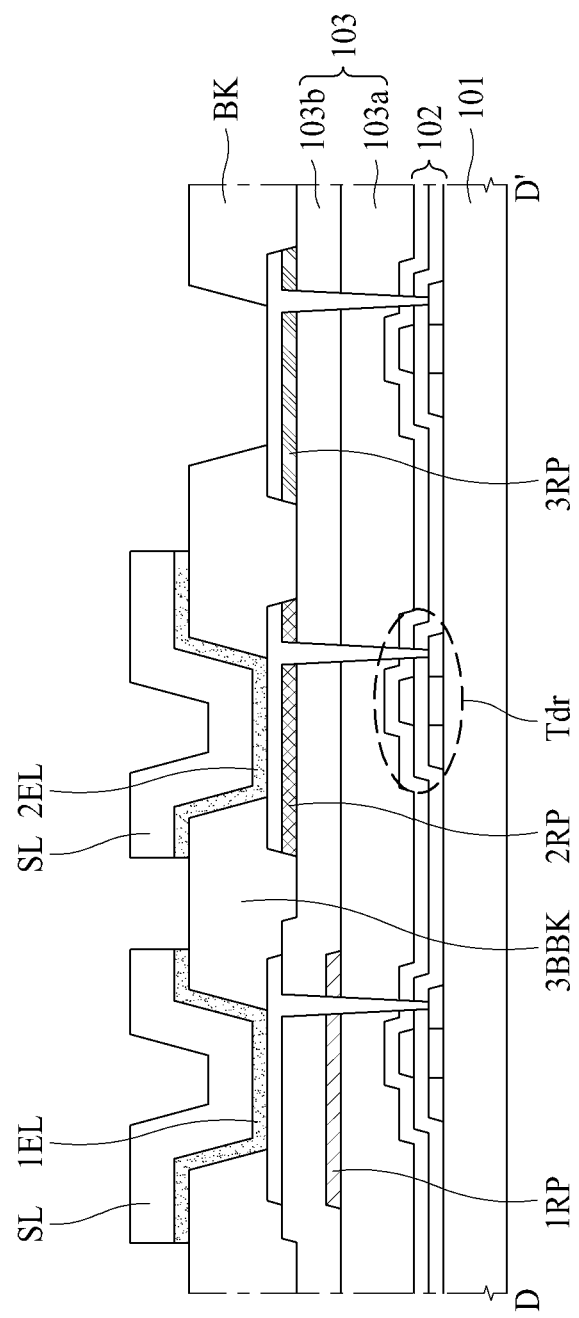

Subsequently, as illustrated in FIG. 12B, by using a residual photoresist PR as a mask, the shielding layer SL and the main emission layer material MELa can be etched. Therefore, the shielding layer SL and the main emission layer material MELa provided in a region corresponding to the third pixel 3P and at a portion of the upper surface of the third boundary bank 3BBK can be removed, and then, the photoresist PR can be removed. In this case, the shielding layer SL provided in a region corresponding to an opening portion of each of the first pixel 1P and the second pixel 2P may not be removed.

Figure 12C:
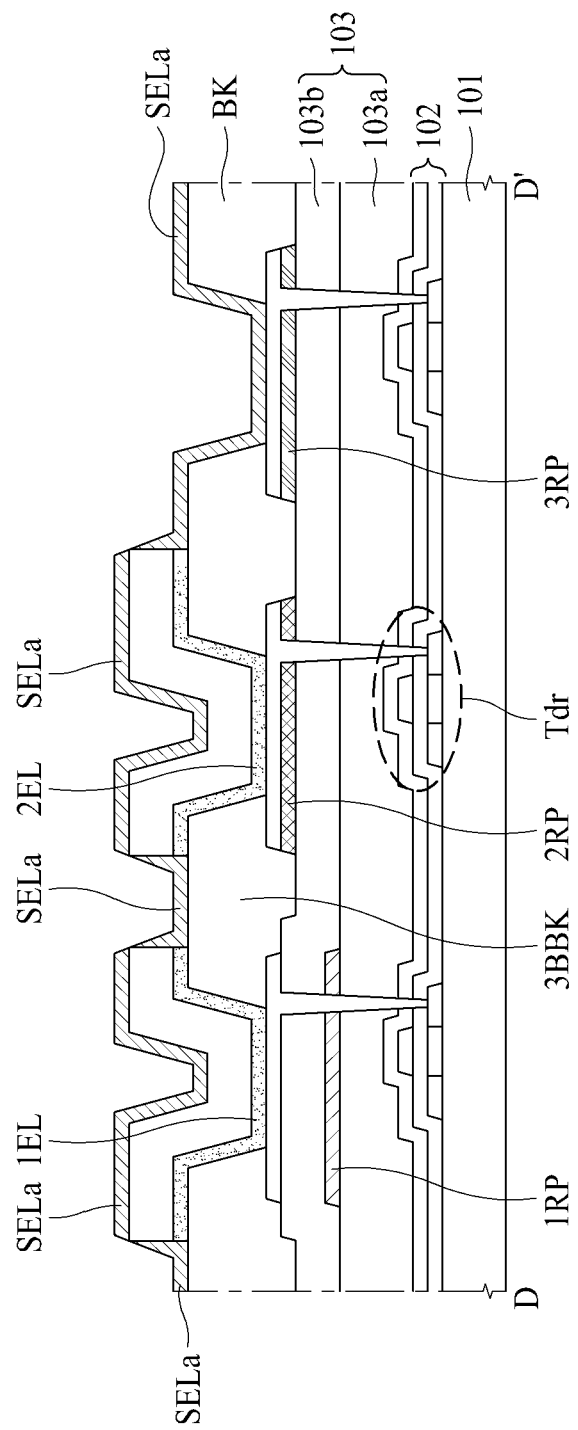

Subsequently, as illustrated in FIG. 12C, a sub emission layer material SELa configuring the sub emission layer SEL can be deposited in the light emitting display panel. Accordingly, the bank and the anode AE of the third pixel 3P, a portion of the upper surface of the third boundary bank 3BBK, and an upper surface of a residual shielding layer SL can be covered by the sub emission layer material SELa.

Figure 12D:
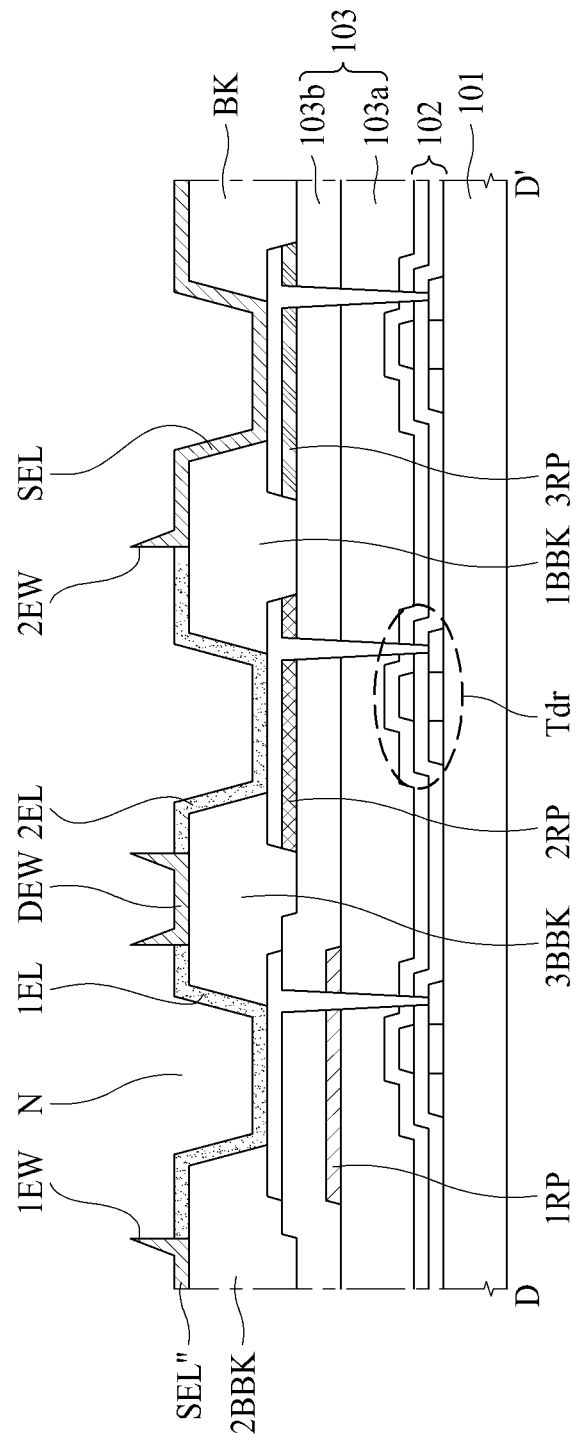

Subsequently, as illustrated in FIG. 12D, the shielding layer SL can be removed. In this case, the sub emission layer material SELa can be provided on an upper surface and lateral surfaces of the shielding layer SL illustrated in FIG. 12C, and thus, when the shielding layer SL is removed, the sub emission layer material SELa provided at an upper end of the shielding layer SL can be removed together with the shielding layer SL. However, the sub emission layer material SELa provided on the lateral surface of the shielding layer SL can be intactly maintained in an original shape.

Therefore, as illustrated in FIG. 12D, the sub emission layer SEL can be formed in a region corresponding to the third pixel 3P, the second emission layer wall 2EW can be formed at the first boundary bank 1BBK, the first emission layer wall 1EW can be formed at the second boundary bank 2BBK, and the division emission layer wall DEW can be formed at the third boundary bank 3BBK.

Figure 12E:
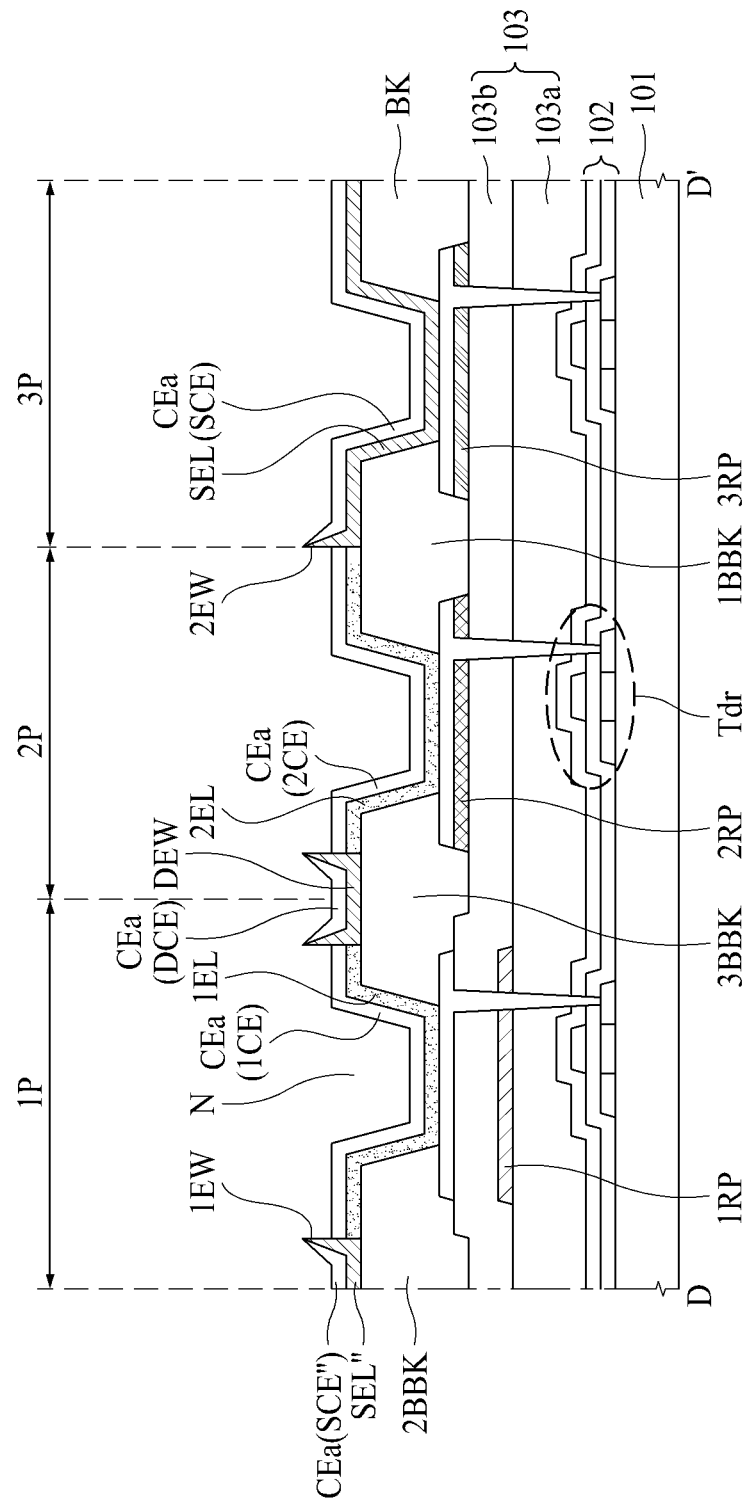

Finally, as illustrated in FIG. 12E, a cathode material CEa included in the cathode CE can be deposited the light emitting display panel 100.

In this case, as illustrated in FIG. 12E, there can be a height difference between the first emission layer wall 1EW and the main emission layer MEL, and thus, the cathode material CEa can be divided by the first emission layer wall 1EW. Also, there can be a height difference between the second emission layer wall 2EW and the main emission layer MEL, and thus, the cathode material CEa can be divided by the second emission layer wall 2EW. Also, there can be a height difference between the division emission layer wall DEW and each of the first emission layer 1EL and the second emission layer 2EL, and thus, the cathode material CEa can be divided by the division emission layer wall DEW provided on the upper surface of the third boundary bank 3BBK.

Therefore, as illustrated in FIG. 12E, the second cathode 2CE and the sub cathode SCE can be divided by using the second emission layer wall 2EW as a boundary, the first cathode 1CE and the other sub cathode SCE" can be divided by using the first emission layer wall 1EW as a boundary, and the first cathode 1CE and the second cathode 2CE can be divided by using the division emission layer wall DEW as a boundary.

The manufacturing method described above with reference to FIGS. 6A to 6C and 12A to 12E can be applied to a method of manufacturing the main connection emission layer wall MCEW illustrated in FIGS. 8 and 9.

Figure 13:
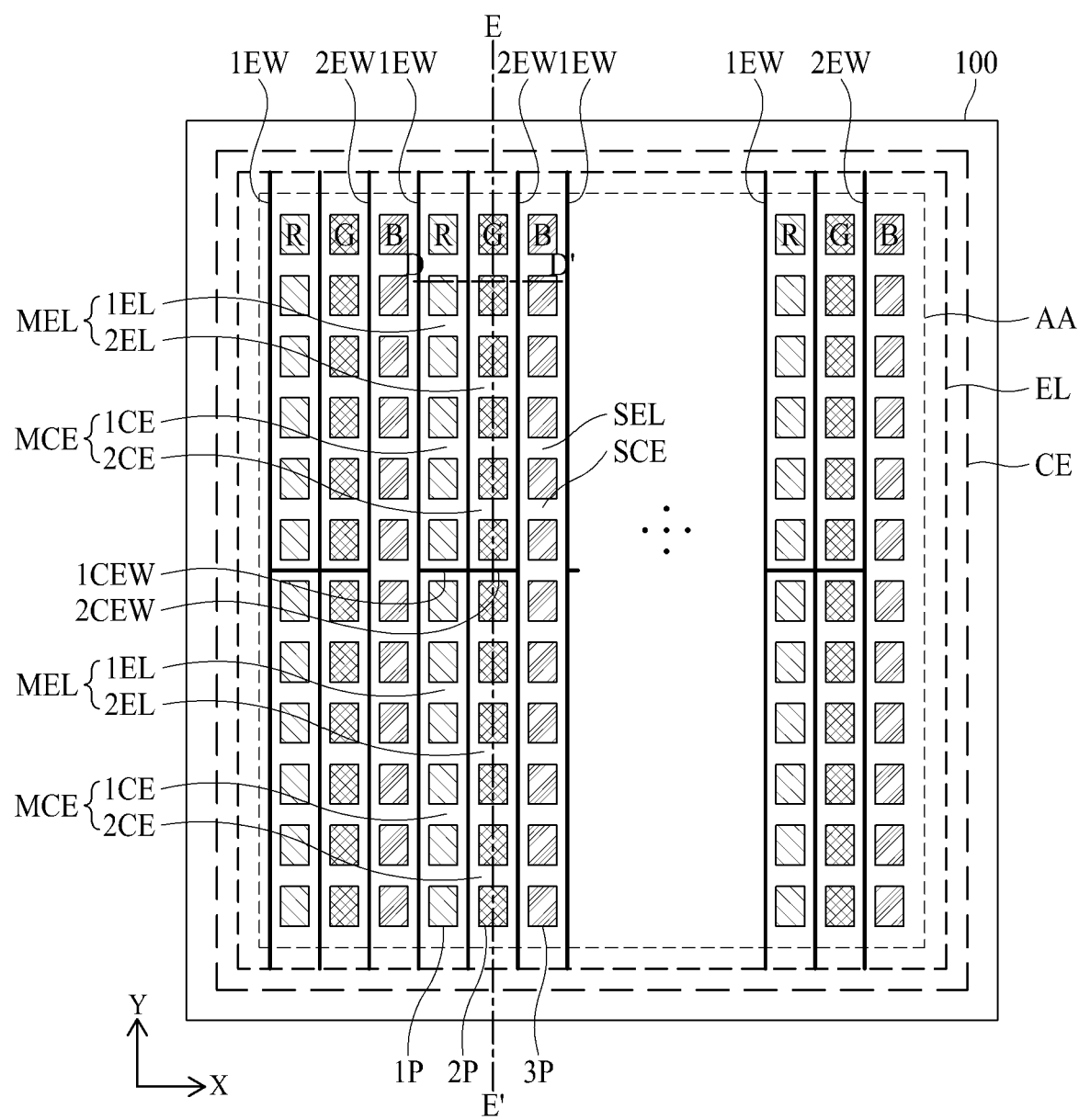
FIG. 13 is another exemplary diagram illustrating a one-dimensional configuration of a light emitting display panel applied to a light emitting display apparatus according to an embodiment of the present disclosure.
Figure 14:
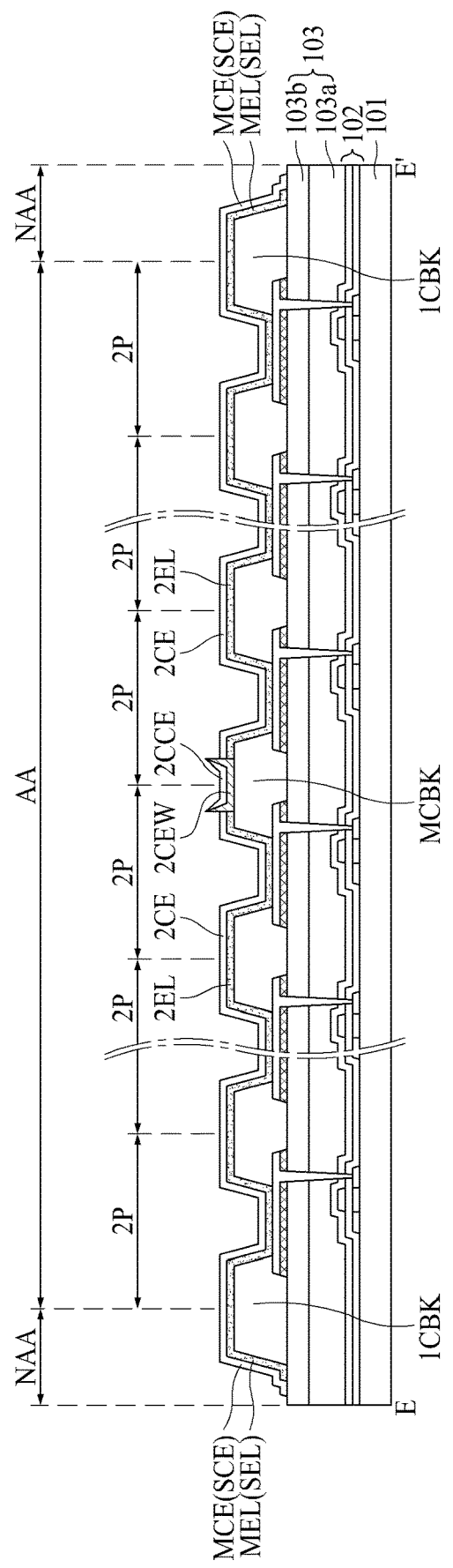
FIG. 14 is an exemplary diagram illustrating a cross-sectional surface taken along line E-E' illustrated in FIG. 13.

FIG. 13 is another exemplary diagram illustrating a one-dimensional configuration of a light emitting display panel applied to a light emitting display apparatus according to the present disclosure, and FIG. 14 is an exemplary diagram illustrating a cross-sectional surface taken along line E-E' illustrated in FIG. 13. More specifically, FIG. 13 is another exemplary diagram illustrating in detail a one-dimensional structure of the light emitting display panel 100 illustrated in FIG. 1. In the following description, descriptions which are the same as or similar to the descriptions of FIGS. 1 to 12 are omitted or will be briefly given.

A light emitting display panel 100, as illustrated in FIG. 13, can include first pixels 1P which are arranged in a first direction Y of a display area AA displaying an image, second pixels 2P which are arranged in parallel with the first pixels 1P in the first direction Y in the display area AA, third pixels 3P which are arranged in parallel with the second pixels 2P in the first direction Y in the display area AA, a first emission layer wall 1EW and a second emission layer wall 2EW which are provided at a first outer portion and a second outer portion, facing each other in the first direction Y, of outer portions surrounding the first pixels 1P and the second pixels 2P, a main cathode MCE which covers an upper end of a main emission layer MEL provided in the first pixels 1P and the second pixels 2P, and a sub-cathode SCE which covers an upper end of a sub emission layer SEL provided in the third pixels 3P. The main cathode MCE and the sub-cathode SCE can be divided in the second emission layer wall 2EW, and the main cathode MCE can be connected with the sub-cathode SCE in at least one of the other outer portions except the first outer portion and the second outer portion.

In this case, comparing with the light emitting display panel illustrated in FIG. 10, the light emitting display panel 100 illustrated in FIG. 13 can further include a first connection emission layer wall 1CEW and a second connection emission layer wall 2CEW. The first connection emission layer wall 1CEW can be provided in the display area AA and can be connected with the first emission layer wall 1EW and a division emission layer wall DEW. The second connection emission layer wall 2CEW can be connected with the first emission layer wall 1EW, the division emission layer wall DEW, and the second emission layer wall 2EW.

For example, the division emission layer wall DEW parallel to the first emission layer wall 1EW and the second emission layer wall 2EW can be provided between the first emission layer wall 1EW and the second emission layer wall 2EW facing each other, the first connection emission layer wall 1CEW connected with the first emission layer wall 1EW and the division emission layer wall DEW can be provided between the first emission layer wall 1EW and the division emission layer wall DEW, and the second connection emission layer wall 2CEW connected with the division emission layer wall DEW and the second emission layer wall 2EW can be provided between the division emission layer wall DEW and the second emission layer wall 2EW.

In this case, the main emission layer MEL can include a first emission layer 1EL provided in the first pixels 1P and a second emission layer 2EL provided in the second pixels 2P, and the main cathode MCE can include a first cathode 1CE covering an upper end of the first emission layer 1EL and a second cathode 2CE covering an upper end of the second emission layer 2EL.

The first cathode 1CE can be divided in the first connection emission layer wall 1CEW, and the second cathode 2CE can be divided in the second connection emission layer wall 2CE. A structure and a method, where the first cathode 1CE is divided in the first connection emission layer wall 1CEW and the second cathode 2CE is divided in the second connection emission layer wall 2CE, can be similar to a structure and a method, where the main cathode MCE is divided in the main connection emission layer wall MCEW, describe above with reference to FIGS. 8 and 9. Therefore, detailed descriptions thereof are omitted. More specifically, a cross-sectional structure illustrated in FIG. 14 can be the same as the cross-sectional structure illustrated in FIG. 9, but in the cross-sectional structure illustrated in FIG. 14, the main cathode MCE illustrated in FIG. 9 can be divided into the second cathodes 2CE.

The first connection emission layer wall 1CEW can protrude to be higher than the first emission layer 1EL at an upper surface of the main emission layer MEL provided between two adjacent first pixels 1P, and the second connection emission layer wall 2CEW can protrude to be higher than the second emission layer 2EL at an upper surface of the main connection bank MCBK provided between two adjacent second pixels 2P. In this case, a center portion of the first connection emission layer wall 1CEW can be formed to be concave, and a center portion of the second connection emission layer wall 2CEW can be formed to be concave.

A first connection cathode 1CCE can be provided on an upper surface of the first connection emission layer wall 1CEW, and a second connection cathode 2CCE can be provided on an upper surface of the second connection emission layer wall 2CEW.

The first cathode 1CE can be divided by the first connection emission layer wall 1CEW, and the second cathode 2CE can be divided by the second connection emission layer wall 2CEW.

The first cathode 1CE, the second cathode 2CE, and the sub-cathode SCE can be connected with one another at each of the other outer portions (for example, a third outer portion and a fourth outer portion) except the first outer portion and the second outer portion. A structure and a method, where the first cathode 1CE and the second cathode 2CE are connected with the sub-cathode SCE at each of the third outer portion and the fourth outer portion, can be the same as a structure and a method, where the main cathode MCE is connected with the sub-cathode SCE at each of the third outer portion and the fourth outer portion.

Figure 15A:
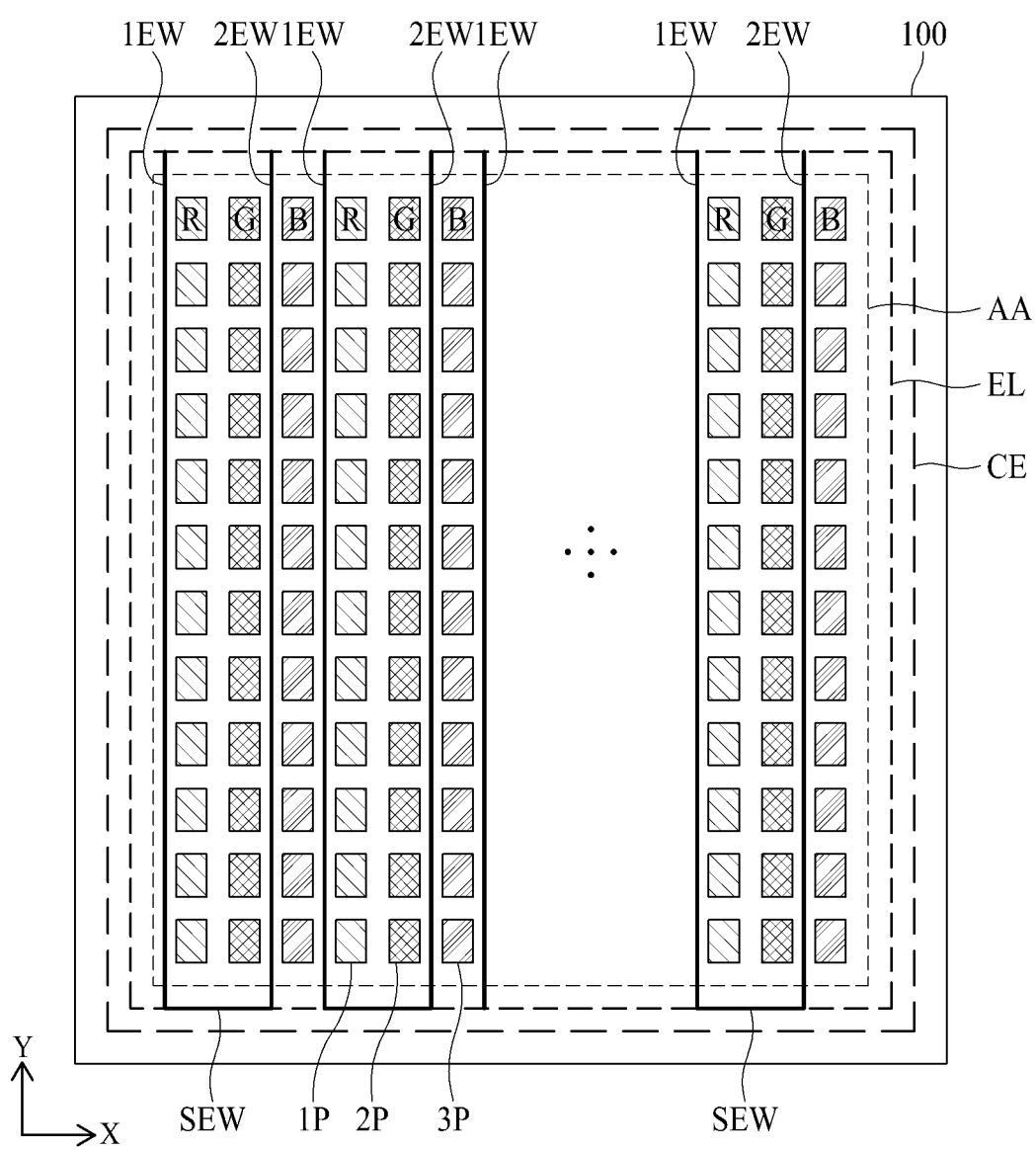
FIGS. 15A to 15C are other exemplary diagrams illustrating a one-dimensional configuration of a light emitting display panel applied to a light emitting display apparatus according to an embodiment of the present disclosure.
Figure 15B:
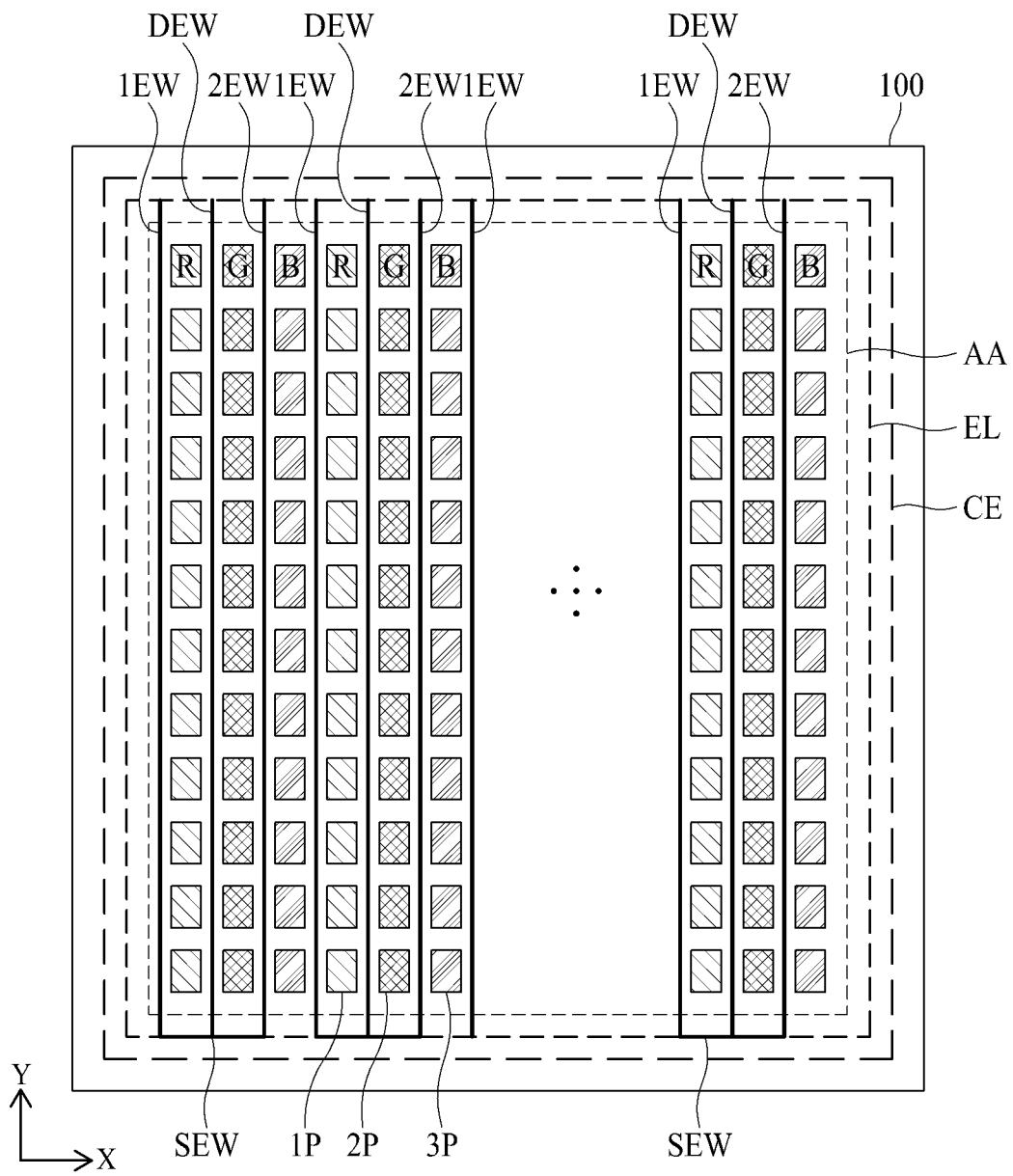
Figure 15C:
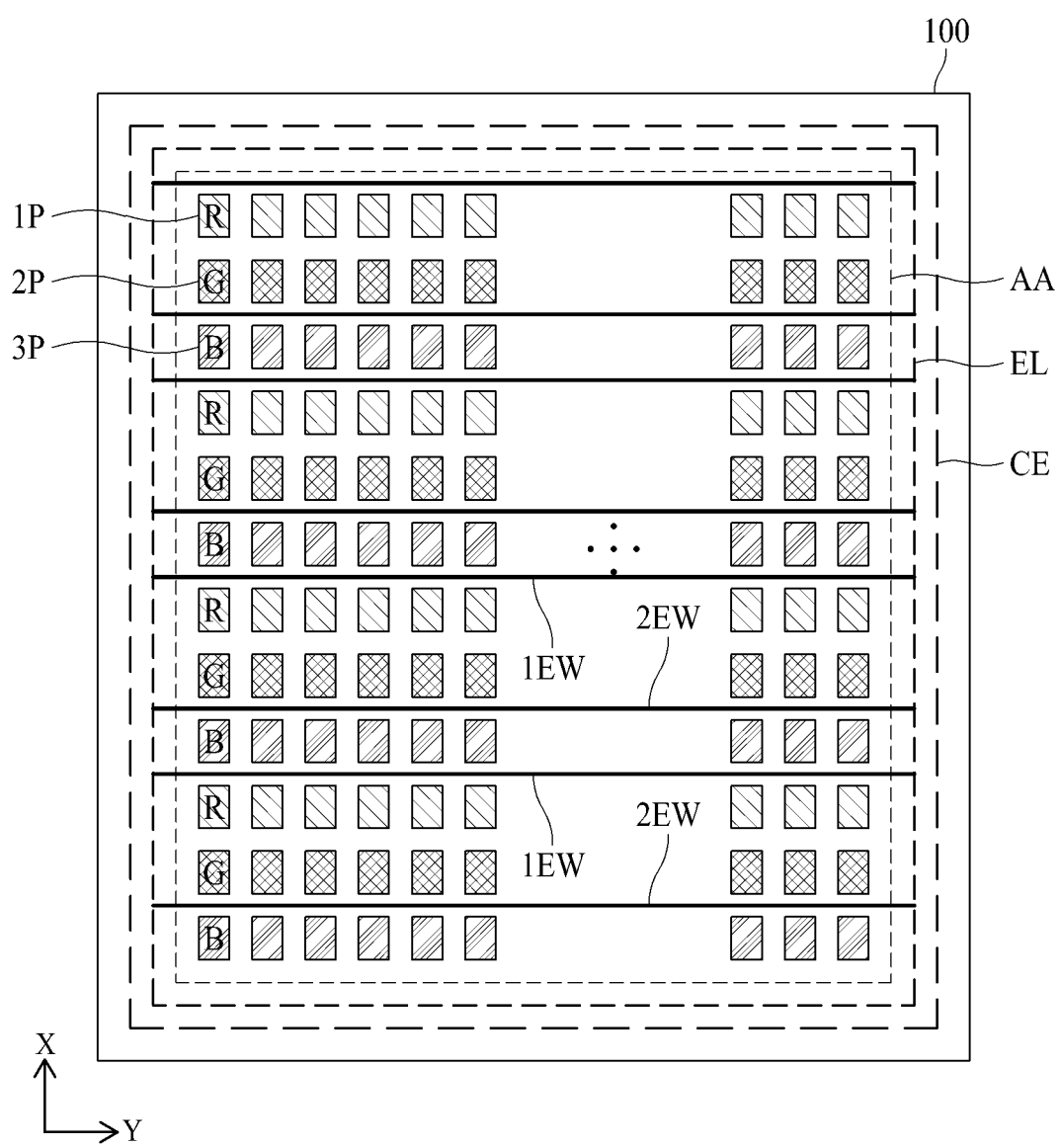

FIGS. 15A to 15C are other exemplary diagrams illustrating a one-dimensional configuration of a light emitting display panel applied to a light emitting display apparatus according to the present disclosure. In the following description, descriptions which are the same as or similar to the descriptions of FIGS. 1 to 14 are omitted or will be briefly given.

As described above, a light emitting display panel 100 can include first pixels 1P which are arranged in a first direction Y of a display area AA displaying an image, second pixels 2P which are arranged in parallel with the first pixels 1P in the first direction Y in the display area AA, third pixels 3P which are arranged in parallel with the second pixels 2P in the first direction Y in the display area AA, a first emission layer wall 1EW and a second emission layer wall 2EW which are provided at a first outer portion and a second outer portion, facing each other in the first direction Y, of outer portions surrounding the first pixels 1P and the second pixels 2P, a main cathode MCE which covers an upper end of a main emission layer MEL provided in the first pixels 1P and the second pixels 2P, and a sub-cathode SCE which covers an upper end of a sub emission layer SEL provided in the third pixels 3P. The main cathode MCE and the sub-cathode SCE can be divided in the second emission layer wall 2EW, and the main cathode MCE can be connected with the sub-cathode SCE in at least one of the other outer portions except the first outer portion and the second outer portion.

First, in the light emitting display panel 100 illustrated in FIG. 3, the first direction Y can be a direction parallel to a data line, and a second direction X can be a direction parallel to a gate line. In this case, the first emission layer wall 1EW and the second emission layer wall 2EW can extend from a non-display area, provided at one end (a third outer portion) in the first direction Y, to a non-display area provided at the other end (a fourth outer portion) in the first direction Y. The main cathode MCE can be connected with the sub-cathode SCE at the third outer portion and the fourth outer portion.

Comparing with the light emitting display panel 100 illustrated in FIG. 3, the light emitting display panel 100 illustrated in FIG. 8 can further include the main connection emission layer wall MCEW.

Comparing with the light emitting display panel 100 illustrated in FIG. 3, the light emitting display panel 100 illustrated in FIG. 10 can further include the division emission layer wall DEW.

Comparing with the light emitting display panel 100 illustrated in FIG. 10, the light emitting display panel 100 illustrated in FIG. 13 can further include the first connection emission layer wall 1CEW and the second connection emission layer wall 2CEW.

Comparing with the light emitting display panel 100 illustrated in FIG. 3, the light emitting display panel 100 illustrated in FIG. 15A can have a difference in that the main cathode MCE is connected with the sub-cathode SCE at only the third outer portion.

For example, in the light emitting display panel 100 illustrated in FIG. 15A, the sub emission layer wall SEW corresponding to the main connection emission layer MCEW can be further provided at the further outer portion. Accordingly, the main cathode MCE and the sub-cathode SCE can be connected with each other at only the third outer portion.

However, when the sub emission layer wall SEW is provided at the third outer portion instead of the fourth outer portion, the main cathode MCE and the sub-cathode SCE can be connected with each other at only the fourth outer portion.

Comparing with the light emitting display panel 100 illustrated in FIG. 15A, the light emitting display panel 100 illustrated in FIG. 15B can further include the division emission layer wall DEW. Accordingly, in the light emitting display panel 100 illustrated in FIG. 15B, the main cathode MCE and the sub-cathode SCE can be connected with each other at only the third outer portion or the fourth outer portion.

Comparing with the light emitting display panel 100 illustrated in FIG. 3, the light emitting display panel 100 illustrated in FIG. 15C can have a difference in that the first direction Y is a direction parallel to the gate line and the second direction X is a direction parallel to the data line.

Finally, the light emitting display panel 100 illustrated in FIG. 15C can include the main connection emission layer wall MCEW described above with reference to FIG. 8, include the division emission layer wall DEW described above with reference to FIG. 10, include the first connection emission layer wall 1CEW and the second connection emission layer wall 2CEW described above with reference to FIG. 13, include the sub emission layer wall SEW described above with reference to FIG. 15A, or include the sub emission layer wall SEW and the division emission layer wall DEW described above with reference to FIG. 15B.

For example, according to the present disclosure, emission layer walls can be provided in various structures, based on a structure, a size, and a characteristic of the light emitting display panel 100.

In the present disclosure, the division emission layer wall DEW can perform a function of preventing a leakage current between adjacent pixels. Also, the main connection emission layer wall MCEW, the first connection emission layer wall 1CEW, and the second connection emission layer wall 2CEW can also perform a function of preventing a leakage current between adjacent pixels.

According to the present disclosure, emission layer walls formed by sub emission layers are provided only on some of the outer portion surrounding a main emission layers, and are not provided on at least one of the outer portion surrounding the main emission layers.

Therefore, a main cathode provided on top of the main emission layer and a sub cathode provided on top of the sub emission layer can be connected through an area where the emission layer wall is not formed. Accordingly, the disconnection problem of the cathode can be solved.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:
1. A light emitting display apparatus comprising:
    a plurality of first pixels arranged in a first direction of a display area configured to display an image;
    a plurality of second pixels arranged in parallel with the plurality of first pixels in the first direction in the display area;
    a plurality of third pixels arranged in parallel with the plurality of second pixels in the first direction in the display area;
    a first emission layer wall and a second emission layer wall provided at a first outer portion and a second outer portion of outer portions surrounding the plurality of first pixels and the plurality of second pixels;
    a main cathode covering an upper end of a main emission layer provided in the plurality of first pixels and the plurality of second pixels; and
    a sub-cathode covering an upper end of a sub emission layer provided in the plurality of third pixels,
    wherein the main cathode and the sub-cathode are divided in the second emission layer wall, and the main cathode and the sub-cathode are connected with each other in at least one of the other outer portions except the first outer portion and the second outer portion.

2. The light emitting display apparatus of claim 1, wherein each of the first emission layer wall and the second emission layer wall comprises a same material as a material of the sub emission layer.

3. The light emitting display apparatus of claim 1, wherein the second emission layer wall is provided on an upper surface of a first boundary bank provided between the plurality of second pixels and the plurality of third pixels, and the second emission layer wall protrudes from an upper surface of the sub emission layer, at an end of the sub emission layer provided in the first boundary bank.

4. The light emitting display apparatus of claim 1, wherein the main emission layer is provided at an upper surface of the first connection bank which is provided in a non-display area surrounding the display area, and the main emission layer is provided in at least one of the other outer portions except the first outer portion and the second outer portion, the main cathode is provided at the upper surface of the main emission layer, and the main cathode is connected with the sub-cathode in the non-display area.

5. The light emitting display apparatus of claim 1, further comprising a main connection emission layer wall provided in the display area and connected with the first emission layer wall and the second emission layer wall, wherein the main cathode and the sub-cathode are respectively connected with the other outer portions except the first outer portion and the second outer portion, and the main cathode is divided by the main connection emission layer wall.

6. The light emitting display apparatus of claim 1, further comprising a division emission layer wall arranged in the first direction between the plurality of first pixels and the plurality of second pixels, and provided in parallel with the first emission layer wall and the second emission layer wall.

7. The light emitting display apparatus of claim 6, wherein the main emission layer comprises a first emission layer provided in the plurality of first pixels and a second emission layer provided in the plurality of second pixels, the main cathode comprises a first cathode covering an upper end of the first emission layer and a second cathode covering an upper end of the second emission layer, the first cathode and the second cathode are divided in the division emission layer wall, and the first cathode, the second cathode, and the sub-cathode are connected with one another at the other outer portions except the first outer portion and the second outer portion.

8. The light emitting display apparatus of claim 6, further comprising:

a first connection emission layer wall provided in the display area and connected with the first emission layer wall and the division emission layer wall; and a second connection emission layer wall connected with the first connection emission layer wall, the division emission layer wall, and the second emission layer wall.

9. The light emitting display apparatus of claim 8, wherein the main emission layer comprises a first emission layer provided in the plurality of first pixels and a second emission layer provided in the plurality of second pixels, the main cathode comprises a first cathode covering an upper end of the first emission layer and a second cathode covering an upper end of the second emission layer, the first cathode is divided in the first connection emission layer wall, the second cathode is divided in the second connection emission layer wall, and the first cathode, the second cathode, and the sub-cathode are connected with one another at the other outer portions except the first outer portion and the second outer portion.

10. The light emitting display apparatus of claim 9, wherein the first connection emission layer wall protrudes to be higher than the first emission layer at an upper surface of the main connection bank provided between two adjacent first pixels, and the second connection emission layer wall protrudes to be higher than the second emission layer at an upper surface of the main connection bank provided between two adjacent second pixels.

11. The light emitting display apparatus of claim 5, wherein the main connection emission layer wall comprises a same material as a material of the sub emission layer.

12. The light emitting display apparatus of claim 11, wherein the main connection emission layer wall is provided at an upper surface of a main connection bank provided between two adjacent first pixels and between two adjacent second pixels, and the main connection emission layer wall protrudes to be higher than an upper surface of the main emission layer, at the upper surface of the main connection bank.

* * * * *